US012621997B2

(12) United States Patent
    Lee et al.

(10) Patent No.: US 12,621,997 B2
(45) Date of Patent: May 5, 2026

(54) SEMICONDUCTOR DEVICES

(71) Applicant: SAMSUNG ELECTRONICS CO., LTD., Suwon-si (KR)

(72) Inventors: Kiseok Lee, Suwon-si (KR); Jinwoo Han, Suwon-si (KR); Hanjin Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 389 days.

(21) Appl. No.: 18/512,331

(22) Filed: Nov. 17, 2023

(65) Prior Publication Data

US 2024/0357832 A1     Oct. 24, 2024

(30) Foreign Application Priority Data

Apr. 24, 2023    (KR) ........................ 10-2023-0053555

(51) Int. Cl.
    *H10B 53/40*        (2023.01)
    *H10B 53/30*        (2023.01)
(52) U.S. Cl.
    CPC ............. *H10B 53/30* (2023.02); *H10B 53/40* (2023.02)
(58) Field of Classification Search
    CPC ........ H10B 53/30; H10B 53/40; H10B 53/20; H10B 12/315; H10B 12/482; H10B 53/50
    See application file for complete search history.

(56) References Cited

U.S. PATENT DOCUMENTS

| | | | |
|---|---|---|---|
| 10,020,360 B1 | 7/2018 | Ramaswamy | |
| 11,177,266 B2 | 11/2021 | Tang et al. | |

| | | | |
|---|---|---|---|
| 11,244,952 B2 | 2/2022 | Chhajed et al. | |
| 11,264,394 B2 | 3/2022 | Derner et al. | |
| 11,404,217 B2 | 8/2022 | Chavan et al. | |

(Continued)

FOREIGN PATENT DOCUMENTS

| | | |
|---|---|---|
| CN | 114256418 | 3/2022 |
| TW | 201842649 A | 12/2018 |

(Continued)

OTHER PUBLICATIONS

Office Action in Taiwanese Appln. No. 112144842, mailed on Jul. 19, 2024, 36 pages (with English translation).

(Continued)

*Primary Examiner* — Elias Ullah
(74) *Attorney, Agent, or Firm* — Fish & Richardson P.C.

(57)        ABSTRACT

A semiconductor device includes a bit line structures on a substrate, extending in a first direction, and being spaced apart from each other in a second direction; channels contacting upper surfaces of the bit line structures and being spaced apart from each other in the first and second directions; upper gate structures extending in the second direction and surrounding the channels disposed in the second direction, the upper gate structures being spaced apart in the first direction; and a capacitor structure including first capacitor electrodes respectively on the channels; a dielectric layer on the first capacitor electrodes, the dielectric layer including a ferroelectric material or an anti-ferroelectric material; a second capacitor electrode layer on the dielectric layer; and capacitor plate electrodes on the second capacitor electrode layer, the capacitor plate electrodes each extending in the second direction and being spaced apart from each other in the first direction.

20 Claims, 27 Drawing Sheets

(56)　　　References Cited

U.S. PATENT DOCUMENTS

| | | |
|---|---|---|
| 11,437,089 B2 | 9/2022 | Kang et al. |
| 11,678,476 B2 | 6/2023 | Cho et al. |
| 11,742,401 B2 | 8/2023 | Yoon et al. |
| 2020/0111800 A1 | 4/2020 | Ramaswamy |
| 2022/0020756 A1 | 1/2022 | Mariani et al. |
| 2022/0102352 A1 | 3/2022 | Lee et al. |
| 2022/0216239 A1 | 7/2022 | Yoo et al. |
| 2023/0112600 A1 | 4/2023 | Yun et al. |

FOREIGN PATENT DOCUMENTS

| | | |
|---|---|---|
| TW | 202224188 | 6/2022 |
| TW | 202230347 | 8/2022 |
| TW | 202316582 | 4/2023 |

OTHER PUBLICATIONS

Office Action in Taiwanese Appln. No. 112144842, mailed on Jan. 23, 2025, 33 pages (with Machine translation).

SEMICONDUCTOR DEVICES

CROSS-REFERENCE TO RELATED APPLICATION

This application claims priority under 35 U.S.C. § 119 to Korean Patent Application No. 10-2023-0053555 filed on Apr. 24, 2023, in the Korean Intellectual Property Office, the disclosure of which is hereby incorporated by reference in its entirety.

1. FIELD

Embodiments relate to a semiconductor device.

2. DESCRIPTION OF THE RELATED ART

A VCT DRAM device may include a bit line structure, a gate structure, a channel, and a capacitor structure. A dielectric layer included in the capacitor structure may include a paraelectric material, which has volatile characteristics.

SUMMARY

The embodiments may be realized by providing a semiconductor device including a substrate; bit line structures on the substrate, the bit line structures each extending in a first direction substantially parallel to an upper surface of the substrate and being spaced apart from each other in a second direction substantially parallel to the upper surface of the substrate and crossing the first direction; channels contacting upper surfaces of the bit line structures and being spaced apart from each other in the first and second directions; upper gate structures each extending in the second direction and surrounding the channels disposed in the second direction, the upper gate structures being spaced apart from each other in the first direction; and a capacitor structure, the capacitor structure including first capacitor electrodes respectively on the channels; a dielectric layer on the first capacitor electrodes, the dielectric layer including a ferroelectric material or an anti-ferroelectric material; a second capacitor electrode layer on the dielectric layer; and capacitor plate electrodes on the second capacitor electrode layer, the capacitor plate electrodes each extending in the second direction and being spaced apart from each other in the first direction.

The embodiments may be realized by providing a semiconductor device including a substrate; a lower circuit pattern on the substrate, the lower circuit pattern including a lower gate structure and a first impurity region; a bit line structure on the lower circuit pattern, the bit line structure being electrically connected to the lower circuit pattern; a channel contacting an upper surface of the bit line structure, the channel including a second impurity region at an upper portion thereof; an upper gate structure surrounding the channel, the upper gate structure being spaced apart from the bit line structure; and a capacitor structure, the capacitor structure including a first capacitor electrode on the second impurity region; a dielectric layer on the first capacitor electrode, the dielectric layer including a ferroelectric material or an anti-ferroelectric material; a second capacitor electrode on the dielectric layer; and a capacitor plate electrode on the second capacitor electrode.

The embodiments may be realized by providing a semiconductor device including a substrate; bit line structures on the substrate, the bit line structures each extending in a first direction substantially parallel to an upper surface of the substrate, and being spaced apart from each other in a second direction substantially parallel to the upper surface of the substrate and crossing the first direction; an insulating interlayer on the substrate, the insulating interlayer covering sidewalls and upper surfaces of the bit line structures; a spacer layer on the insulating interlayer; upper gate structures on the spacer layer, the upper gate structures each extending in the second direction and being spaced apart from each other in the first direction; channels each extending through a corresponding one of the upper gate structures, the spacer layer, and an upper portion of the insulating interlayer and contacting an upper surface of a corresponding one of the bit line structures, the channels being spaced apart from each other in the first and second directions; and a capacitor structure, the capacitor structure including first capacitor electrodes respectively on the channels; a dielectric layer on the first capacitor electrodes, the dielectric layer including a ferroelectric material or an anti-ferroelectric material; a second capacitor electrode layer on the dielectric layer; and capacitor plate electrodes on the second capacitor electrode layer, the capacitor plate electrodes each extending in the second direction and being spaced apart from each other in the first direction.

BRIEF DESCRIPTION OF THE DRAWINGS

Features will be apparent to those of skill in the art by describing in detail exemplary embodiments with reference to the attached drawings in which.

DETAILED DESCRIPTION

It will be understood that, although the terms "first," "second," and/or "third" may be used herein to describe various materials, layers, regions, pads, electrodes, patterns, structure and/or processes, these various materials, layers, regions, pads, electrodes, patterns, structure and/or processes should not be limited by these terms, e.g., the terms are not intended to imply or require sequential inclusion. These terms are only used to distinguish one material, layer, region, pad, electrode, pattern, structure or process from another material, layer, region, pad, electrode, pattern, structure or process. Thus, "first", "second" and/or "third" may be used selectively or interchangeably for each material, layer, region, electrode, pad, pattern, structure or process respectively.

Hereinafter, two directions crossing each other among horizontal directions substantially parallel to an upper surface of a substrate may be referred to as first and second directions D1 and D2, respectively, and a vertical direction substantially perpendicular to the upper surface of the substrate may be referred to as a third direction D3.

Figure 1:
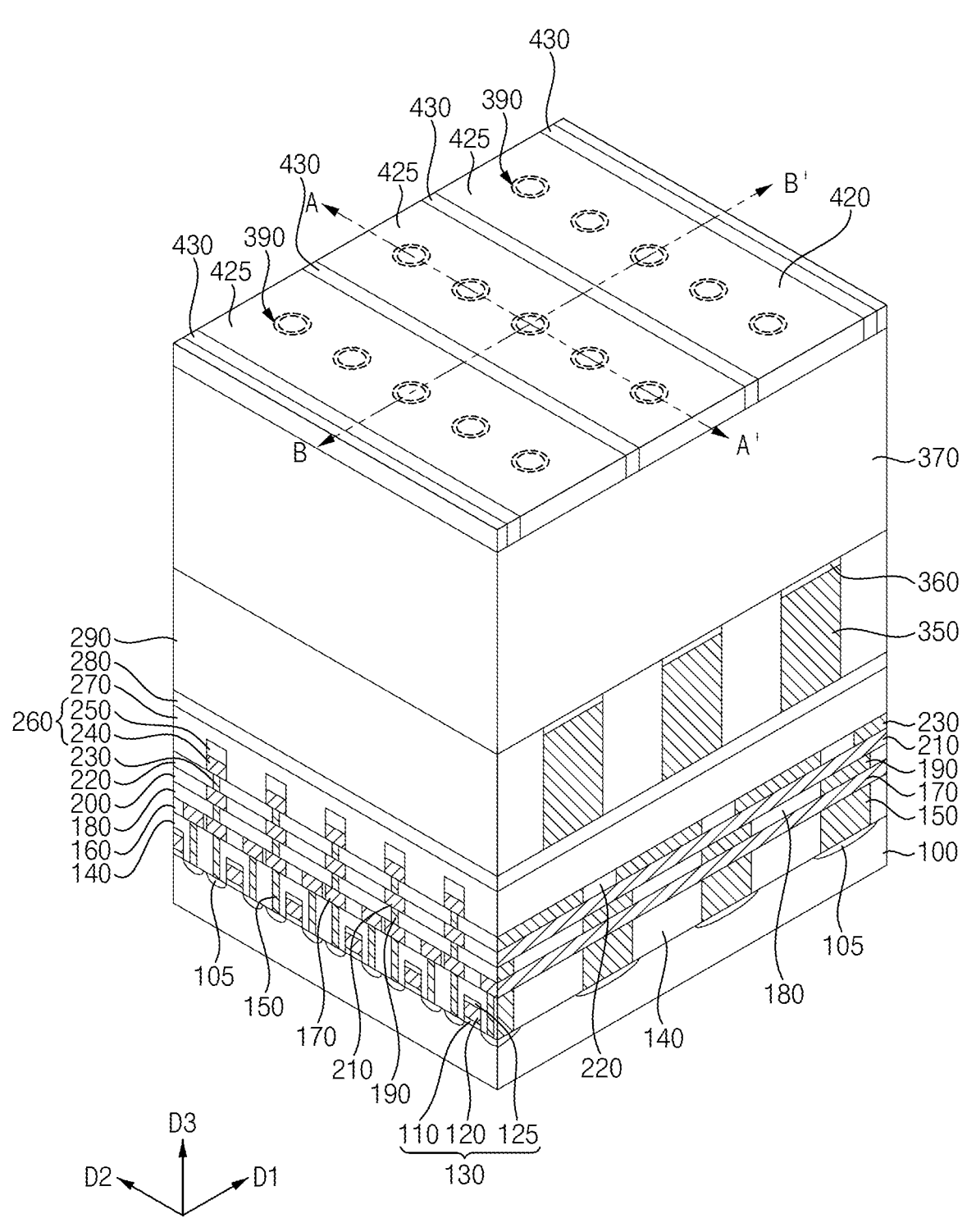
FIGS. 1 to 3 are a perspective view and cross-sectional views illustrating a semiconductor device in accordance with example embodiments.
Figure 2:
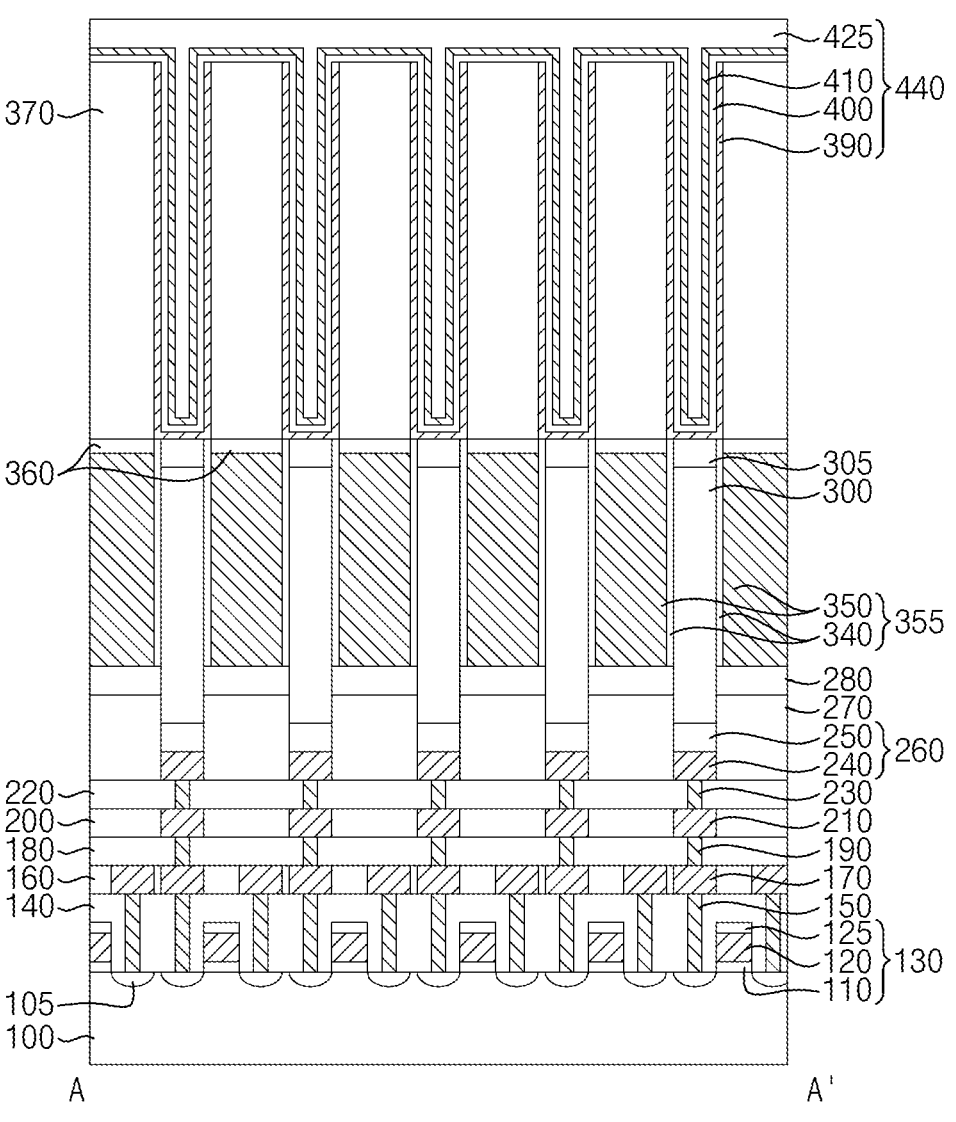
Figure 2:
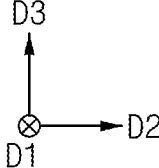
Figure 3:
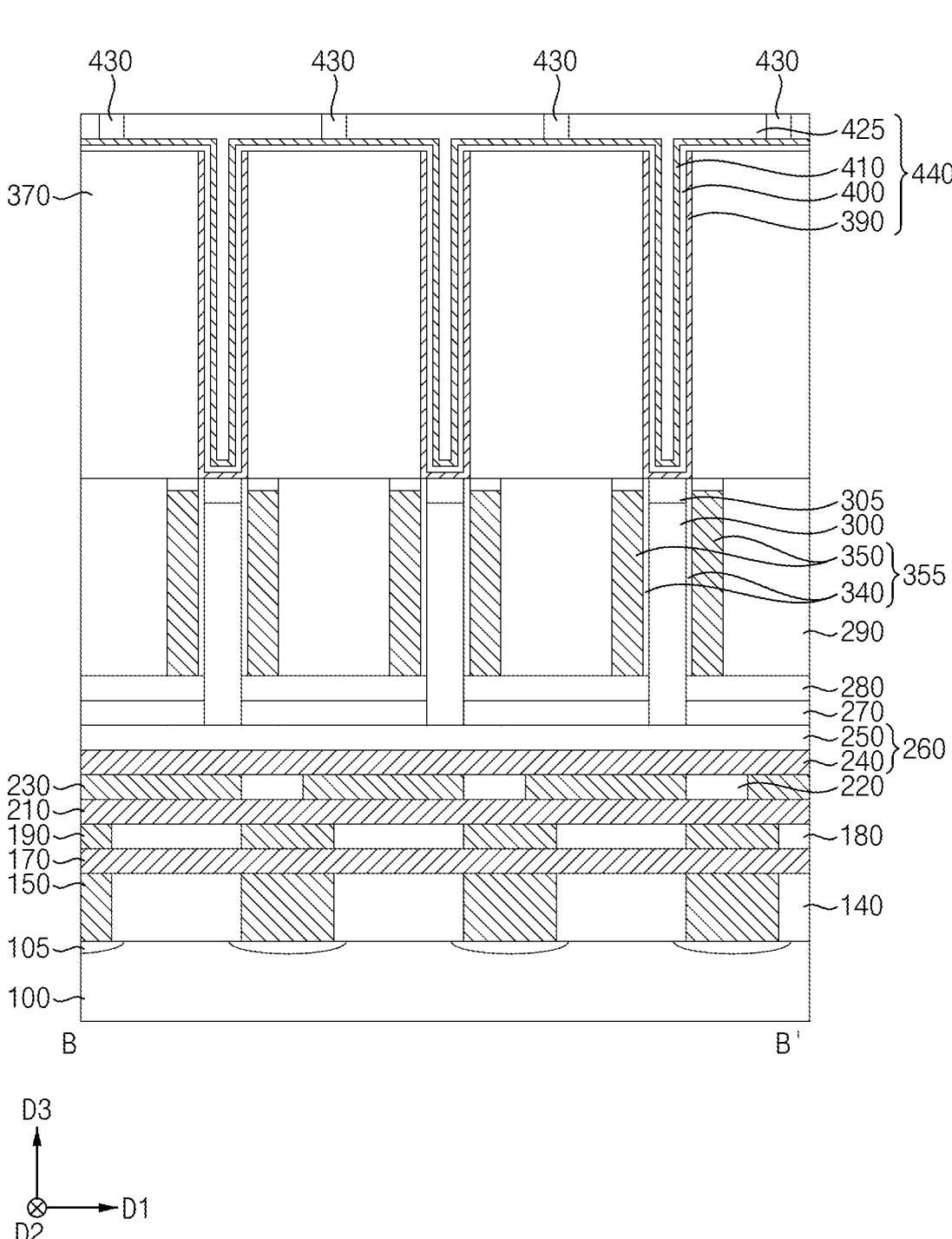

FIGS. 1 to 3 are a perspective view and cross-sectional views illustrating a semiconductor device in accordance with example embodiments. Specifically, FIG. 1 is the perspective view, FIG. 2 is a cross-sectional view taken along line A-A' of FIG. 1, and FIG. 3 is a cross-sectional view taken along line B-B' of FIG. 1.

The semiconductor device may include a lower circuit pattern, a bit line structure 260, a channel 300, an upper gate structure 355, and a capacitor structure 440 on a substrate 100.

The semiconductor device may further include first to third upper insulating interlayers 270, 290 and 370, a spacer layer 280, and first and second insulation patterns 360 and 430.

The substrate 100 may include a semiconductor material, e.g., silicon, germanium, silicon-germanium, or the like, or a III-V group compound semiconductor, e.g., GaP, GaAs, GaSb, or the like. In an implementation, the substrate 100 may be a silicon-on-insulator (SOI) substrate or a germanium-on-insulator (GOI) substrate. As used herein, the term "or" is not necessarily an exclusive term, e.g., "A or B" would include A, B, or A and B.

The lower circuit pattern may be on the substrate 100, and may be covered by first to fifth lower insulating interlayers 140, 160, 180, 200 and 220 sequentially stacked in the third direction D3. Each of the first to fifth lower insulating interlayers 140, 160, 180, 200 and 220 may include an oxide, e.g., silicon oxide, or an insulating nitride, e.g., silicon nitride.

A cell array may be on the lower circuit pattern, and the semiconductor device may have a cell over periphery (COP) structure. The lower circuit pattern may include transistors for applying electrical signals to the cell array. The transistors may include some or all of circuit patterns constituting peripheral circuits, e.g., a bit line sense amplifier (BLSA), a column decoder, a column select line (CSL) driver, an input/output sense amplifier (I/O SA), a write driver, a sub-word line driver (SWD), or the like.

Each of the transistors may include, e.g., a lower gate structure 130 and first impurity regions 105 on portions of the substrate 100 adjacent to the lower gate structure 130, which may serve as source/drain regions, respectively.

The lower gate structure 130 may include a lower gate insulation pattern 110, a lower gate electrode 120 and a lower gate mask 125 sequentially stacked on the substrate 100 in the third direction D3. In an implementation, the lower gate structure 130 may extend (e.g., lengthwise) in the first direction D1 on the substrate 100, and a plurality of lower gate structures 130 may be spaced apart from each other in the second direction D2.

The lower gate insulation pattern 110 may include an oxide, e.g., silicon oxide, the lower gate electrode 120 may include a conductive material, e.g., a metal, a metal nitride, a metal silicide, or polysilicon doped with impurities, and the lower gate mask 125 may include an insulating nitride, e.g., silicon nitride. The first impurity regions 105 may include, e.g., a semiconductor material doped with n-type impurities or p-type impurities.

Lower contact plugs and lower wirings may be electrically connected to each of the transistors. As illustrated in FIGS. 1 to 3, first to third lower contact plugs 150, 190 and 230 and first and second lower wirings 170 and 210 may be present, or the number and the layout of the lower contact plugs and the lower wirings may be variously modified.

The first lower contact plug 150 may extend through the first lower insulating interlayer 140 and contact an upper surface of each of the first impurity regions 105, the first lower wiring 170 may extend through the second lower insulating interlayer 160 and contact an upper surface of the first lower contact plug 150, the second lower contact plug 190 may extend through the third lower insulating interlayer

180 and contact an upper surface of the first lower wiring 170, the second lower wiring 210 may extend through the fourth lower insulating interlayer 200 and contact an upper surface of the second lower contact plug 190, and the third lower contact plug 230 may extend through the fifth lower insulating interlayer 220 and contact an upper surface of the second lower wiring 210.

In an implementation, the first lower wiring 170 may extend in the first direction D1, and a plurality of first lower wirings 170 may be spaced apart from each other in the second direction D2. The second lower wiring 210 may also extend in the first direction D1, and a plurality of second lower wirings 210 may be spaced apart from each other in the second direction D2. A plurality of first lower contact plugs 150 may be spaced apart from each other in the first and second directions D1 and D2, a plurality of second lower contact plugs 190 may be spaced apart from each other in the first and second directions D1 and D2, and a plurality of third lower contact plugs 230 may be spaced apart from each other in the first and second directions D1 and D2.

The bit line structure 260 may be on the fifth lower insulating interlayer 220 and the third lower contact plug 230, and may include first and second bit lines 240 and 250 stacked in the third direction D3. The first bit line 240 may include a metal, e.g., tungsten or copper, and the second bit line 250 may include, e.g., polysilicon doped with n-type impurities.

In an implementation, the bit line structure 260 may extend in the first direction D1, and a plurality of bit line structures 260 may be spaced apart from each other in the second direction D2. Each of the bit line structures 260 may contact an upper surface of a corresponding one of the third lower contact plugs 230 disposed in the first direction D1.

The first upper insulating interlayer 270 may be on the fifth lower insulating interlayer 220, and cover the bit line structure 260. The first upper insulating interlayer 270 may include an oxide, e.g., silicon oxide.

The channel 300 may extend through an upper portion of the first upper insulating interlayer 270, and contact an upper surface of the bit line structure 260. The channel 300 may have a pillar shape extending in the third direction D3, and have, e.g., a circular shape, an elliptical shape, a polygonal shape, a polygonal shape with rounded vertices, or the like, in a plan view.

In an implementation, the channel 300 may include, e.g., undoped polysilicon or undoped single crystalline silicon. In an implementation, the channel 300 may include an oxide semiconductor material, e.g., IGZO.

In an implementation, a second impurity region 305 including n-type or p-type impurities may be at an upper portion of the channel 300. In an implementation, the second impurity region 305 may be a part of the upper portion of the channel 300. In an implementation, the second impurity region 305 may be a separate layer structure on the channel 300.

The spacer layer 280 may be on the first upper insulating interlayer 270, and the spacer layer 280 together with an upper portion of the first upper insulating interlayer 270 may surround and contact a sidewall of a lower portion of the channel 300. The spacer layer 280 may include an insulating nitride, e.g., silicon nitride, polysilicon, or silicon-germanium.

The upper gate structure 355 may be on the spacer layer 280. In an implementation, the upper gate structure 355 may extend in the second direction D2, and a plurality of upper gate structures 355 may be spaced apart from each other in the first direction D1.

The upper gate structure 355 may include upper gate insulation patterns 340 contacting upper sidewalls of the channels 300, respectively, disposed in the second direction D2, and an upper gate electrode 350, which may cover outer sidewalls of the upper gate insulation patterns 340 and extend in the second direction D2. In an implementation, an upper surface of each of the upper gate insulation patterns 340 may be substantially coplanar with an upper surface of the second impurity region 305, which may be at the upper portion of the channel 300 or separately on the channel 300. In an implementation, an upper surface of the upper gate electrode 350 may be lower (e.g., closer to the substrate in the third direction D3) than the upper surface of each of the upper gate insulation patterns 340.

The first insulation pattern 360 may be on the upper gate electrode 350. In an implementation, an upper surface of the first insulation pattern 360 may be substantially coplanar with the upper surfaces of the channel 300 and the upper gate insulation pattern 340.

The upper gate insulation pattern 340 may include oxide, e.g., silicon oxide, the upper gate electrode 350 may include a conductive material, e.g., a metal nitride, or a metal silicide, and the first insulation pattern 360 may include an oxide, e.g., silicon oxide.

The second upper insulating interlayer 290 may be on the spacer layer 280, may extend in the second direction D2, and may contact (e.g., directly contact) sidewalls in the first direction D1 of the upper gate structure 355 and the first insulation pattern 360. The second upper insulating interlayer 290 may include an oxide, e.g., silicon oxide.

The third upper insulating interlayer 370 may be on the second upper insulating interlayer 290, the upper gate structure 355 and the second impurity region 305. The third upper insulating interlayer 370 may include an oxide, e.g., silicon oxide.

The capacitor structure 440 may include a first capacitor electrode 390, a dielectric layer 400, a second capacitor electrode 410, and a capacitor plate electrode 425.

The first capacitor electrode 390 may be on a sidewall of each of third openings 380 (refer to FIGS. 19 to 21), which may extend through the third upper insulating interlayer 370 and expose the upper surface of the second impurity region 305, may be spaced apart from each other in the first and second directions D1 and D2, and may be on the upper surface of the second impurity region 305. In an implementation, the first capacitor electrode 390 may have a cup shape, and a plurality of first capacitor electrodes 390 may be spaced apart from each other in the first and second directions D1 and D2.

The dielectric layer 400 and the second capacitor electrode 410 may be sequentially stacked on the first capacitor electrodes 390 and the third upper insulating interlayer 370. The capacitor plate electrode 425 may be on the second capacitor electrode 410, and may fill remaining portions of the third openings 380.

Each of the first capacitor electrode 390 and the second capacitor electrode 410 may include, e.g., a metal or a metal nitride, etc.

In an implementation, the capacitor plate electrode 425 may extend in the second direction D2 and a plurality of capacitor plate electrodes 425 may be spaced apart from each other in the first direction D1. Each of the capacitor plate electrodes 425 may overlap a corresponding one of the upper gate structures 355 in the third direction D3. The capacitor plate electrode 425 may include, e.g., silicon-germanium doped with impurities.

The second insulation pattern 430 may be between ones of the capacitor plate electrodes 425 that are adjacent to each other in the first direction D1. The second insulation pattern 430 may extend in the second direction D2 on the second capacitor electrode 410, and a plurality of second insulation patterns 430 may be spaced apart from each other in the first direction D1. The second insulation pattern 430 may include an oxide, e.g., silicon oxide or an insulating nitride, e.g., silicon nitride.

In an implementation, the dielectric layer 400 may include a ferroelectric material or an anti-ferroelectric material.

In an implementation, the dielectric layer 400 may include a perovskite material, e.g., barium titanium oxide (BaTiO$_x$), a hafnium fluorite material, or a ferroelectric material, e.g., a hafnium zirconium oxide (Hf$_x$Zr$_{1-x}$O$_y$).

In an implementation, the dielectric layer 400 may include an anti-ferroelectric material, e.g., zirconium oxide (ZrO$_2$), hafnium zirconium oxide (Hf$_x$Zr$_{1-x}$O$_y$), lead zirconium oxide (PbZrO$_3$), sodium niobium oxide (NaNbO$_3$), or the like.

In an implementation, the dielectric layer 400 may include the ferroelectric material or the anti-ferroelectric material doped with element, e.g., aluminum (Al), barium (Ba), silicon (Si), yttrium (Y), scandium (Sc), strontium (Sr), or the like.

In an implementation, the dielectric layer 400 may include the ferroelectric material or the anti-ferroelectric material doped with, e.g., a lanthanide rare earth element.

The capacitor structure 440 may include the dielectric layer 400 including a ferroelectric material or an anti-ferroelectric material, e.g., instead of a dielectric layer including a paraelectric material, and may have non-volatile characteristics. In an implementation, the channel 300 electrically connected to the capacitor structure 440 may not necessarily have low leakage current characteristics.

In an implementation, the channel 300 may include, e.g., polysilicon or an oxide semiconductor material, e.g., IGZO instead of single crystalline silicon, so that the channel 300 may not necessarily be at an upper portion of the substrate 100 containing single crystalline silicon. In an implementation, in the semiconductor device, a peripheral circuit pattern may be a lower circuit pattern between the substrate 100 and the cell array including the channel 300, and the semiconductor device may have a COP structure.

The dielectric layer 400 may include a ferroelectric material or an anti-ferroelectric material, instead of a paraelectric material, so as to have a non-volatile characteristic and an increased retention time. In an implementation, the first capacitor electrode 390 and the second capacitor electrode 410 in contact with the dielectric layer 400 may not have large areas, and upper surfaces of the first capacitor electrode 390 and the second capacitor electrode 410 may not be high. In an implementation, the difficulty of forming the first capacitor electrode 390 and the second capacitor electrode 410 may be reduced.

In an implementation, a plurality of capacitor plate electrodes 425, each of which may extend in the second direction D2, may be spaced apart from each other in the first direction D1, and different voltages may be applied to the capacitor plate electrodes 425, respectively. In an implementation, the dielectric layer 400 may include a ferroelectric material or an anti-ferroelectric material, and the performance of the capacitor structure 440 may vary depending on a voltage applied to the capacitor plate electrode 425. In an implementation, the performance of the capacitor structure 440 may be easily adjusted by applying different voltages to the capacitor plate electrodes 425, respectively.

FIGS. 4 to 24 are perspective views and cross-sectional views of stages in a method of manufacturing a semiconductor device according to example embodiments. Specifically, FIGS. 4-7, 10, 13, 16, 19 and 22 are perspective views, FIGS. 8, 11, 14, 17, 20 and 23 are cross-sectional views taken along lines A-A' of corresponding perspective views, respectively, and FIGS. 9, 12, 15, 18, 21 and 24 are cross-sectional views taken along lines B-B' of corresponding perspective views, respectively.

Figure 4:
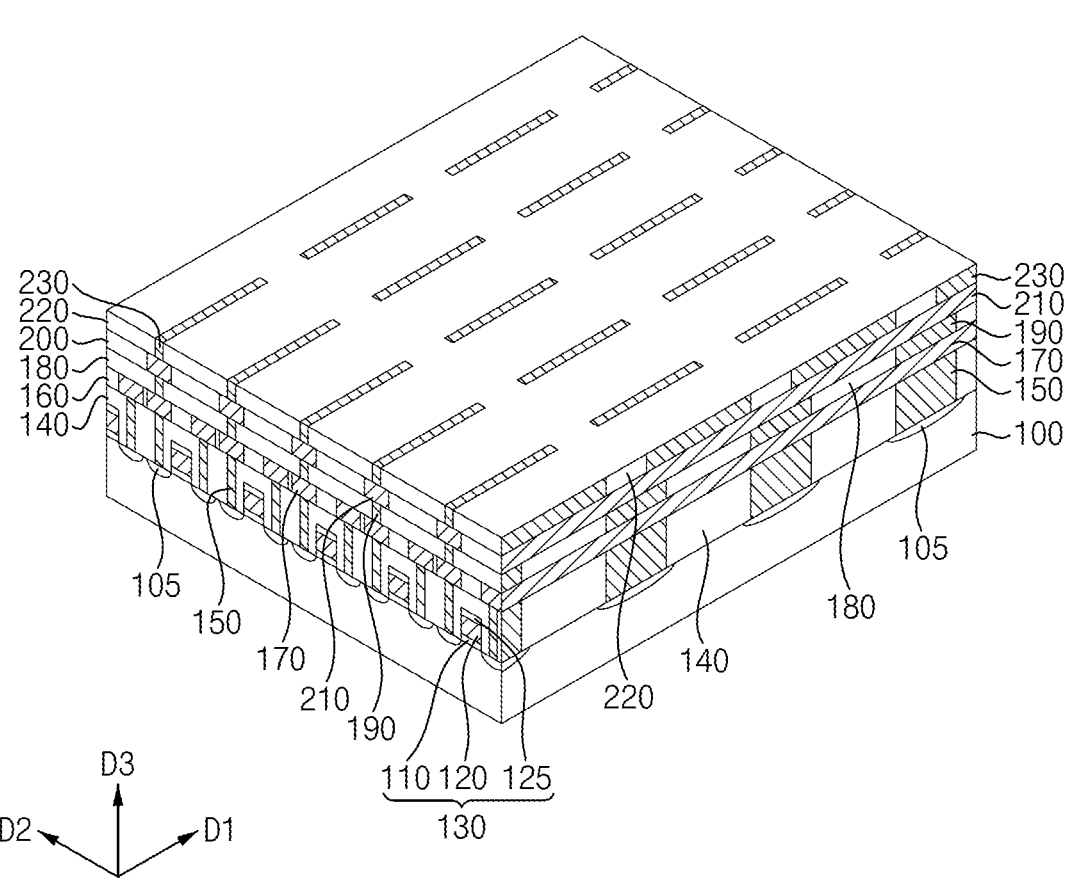
FIGS. 4 to 24 are perspective views and cross-sectional views of stages in a method of manufacturing a semiconductor device in accordance with example embodiments.

Referring to FIG. 4, a lower gate structure 130 may be formed on a substrate 100, a first lower insulating interlayer 140 may be formed on the substrate 100 to cover the lower gate structure 130, and a first lower contact plug 150 may be formed through the first lower insulating interlayer 140 to contact an upper surface of the substrate 100.

The lower gate structure 130 may include a lower gate insulation pattern 110, a lower gate electrode 120 and a lower gate mask 125 sequentially stacked on the substrate 100 in the third direction D3. In an implementation, the lower gate structure 130 may extend in the first direction D1 on the substrate 100, and a plurality of lower gate structures 130 may be spaced apart from each other in the second direction D2.

First impurity regions 105 may be formed at upper portions, respectively, of the substrate 100 adjacent to the lower gate structure 130, and the first lower contact plug 150 may be formed to contact an upper surface of each of the first impurity regions 105. The lower gate structure 130 and the first impurity region 105 may collectively form a transistor, and the first impurity regions 105 may serve as source/drain regions of the transistor.

A second lower insulating interlayer 160 may be formed on the first lower insulating interlayer 140 and the first lower contact plug 150, a lower wiring 170 may be formed through the second lower insulating interlayer 160 to contact an upper surface of the first lower contact plug 150, a third lower insulating interlayer 180 may be formed on the second lower insulating interlayer 160 and the first lower wiring 170, a second lower contact plug 190 may be formed through the third lower insulating interlayer 180 to contact an upper surface of the first lower wiring 170, a fourth lower insulating interlayer 200 may be formed on the third lower insulating interlayer 180 and the second lower contact plug 190, a second lower wiring 210 may be formed through the fourth lower insulating interlayer 200 to contact an upper surface of the second lower contact plug 190, a fifth lower insulating interlayer 220 may be formed on the fourth lower insulating interlayer 200 and the second lower wiring 210, and a third lower contact plug 230 may be formed through the fifth lower insulating interlayer 220 to contact an upper surface of the second lower wiring 210.

In an implementation, the first lower wiring 170 may extend in the first direction D1, and a plurality of first lower wirings 170 may be spaced apart from each other in the second direction D2. The second lower wiring 210 may also extend in the first direction D1, and a plurality of second lower wirings 210 may be spaced apart from each other in the second direction D2. A plurality of first lower contact plugs 150 may be spaced apart from each other in the first and second directions D1 and D2, a plurality of second lower contact plugs 190 may be spaced apart from each other in the first and second directions D1 and D2, and a plurality of third lower contact plugs 230 may be spaced apart from each other in the first and second directions D1 and D2.

Figure 5:
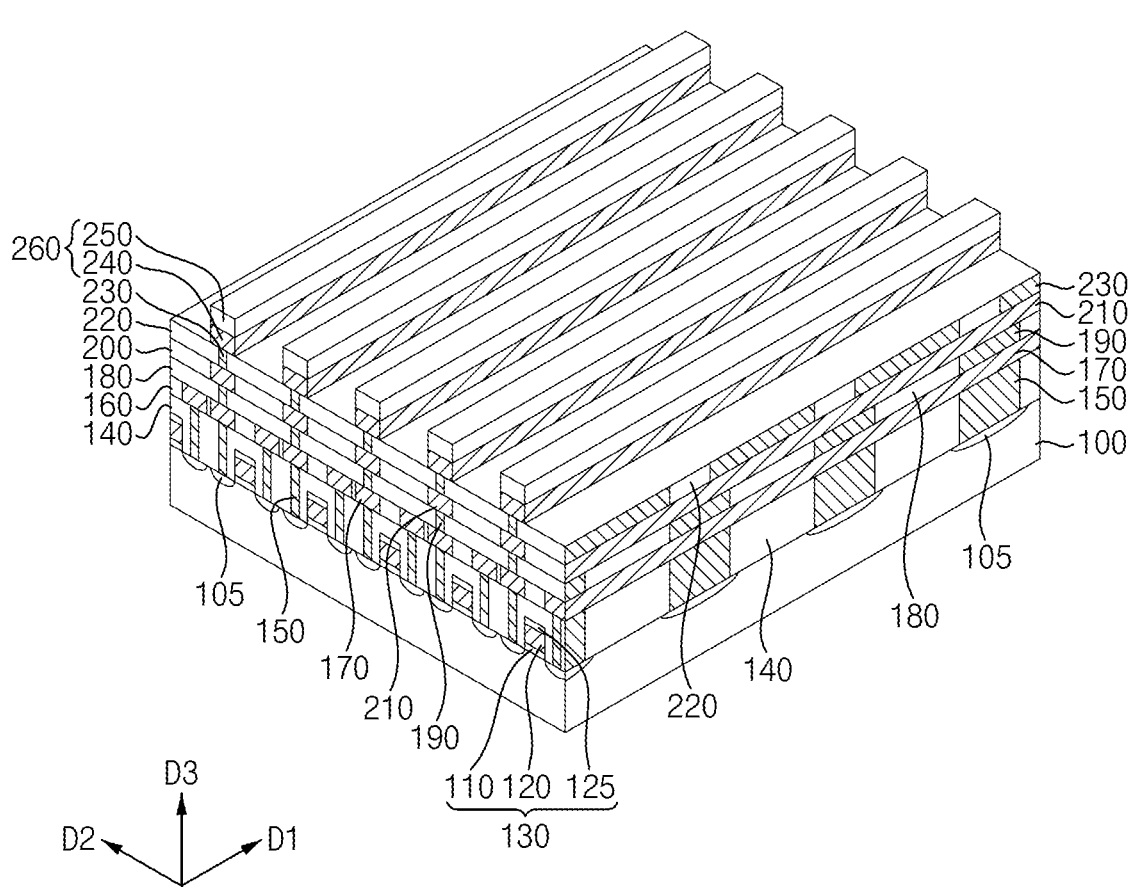

Referring to FIG. 5, a bit line structure 260 may be formed on the fifth lower insulating interlayer 220 and the third lower contact plug 230.

In an implementation, the bit line structure 260 may include a first bit line 240 and a second bit line 250 stacked in the third direction D3. The first bit line 240 may include a metal, e.g., tungsten or copper, and the second bit line 250 may include, e.g., polysilicon doped with n-type impurities.

In an implementation, the bit line structure 260 may extend in the first direction D1, and a plurality of bit line structures 260 may be spaced apart from each other in the second direction D2. Each of the bit line structures 260 may contact upper surfaces of the third lower contact plugs 230 disposed in the first direction D1.

Figure 6:
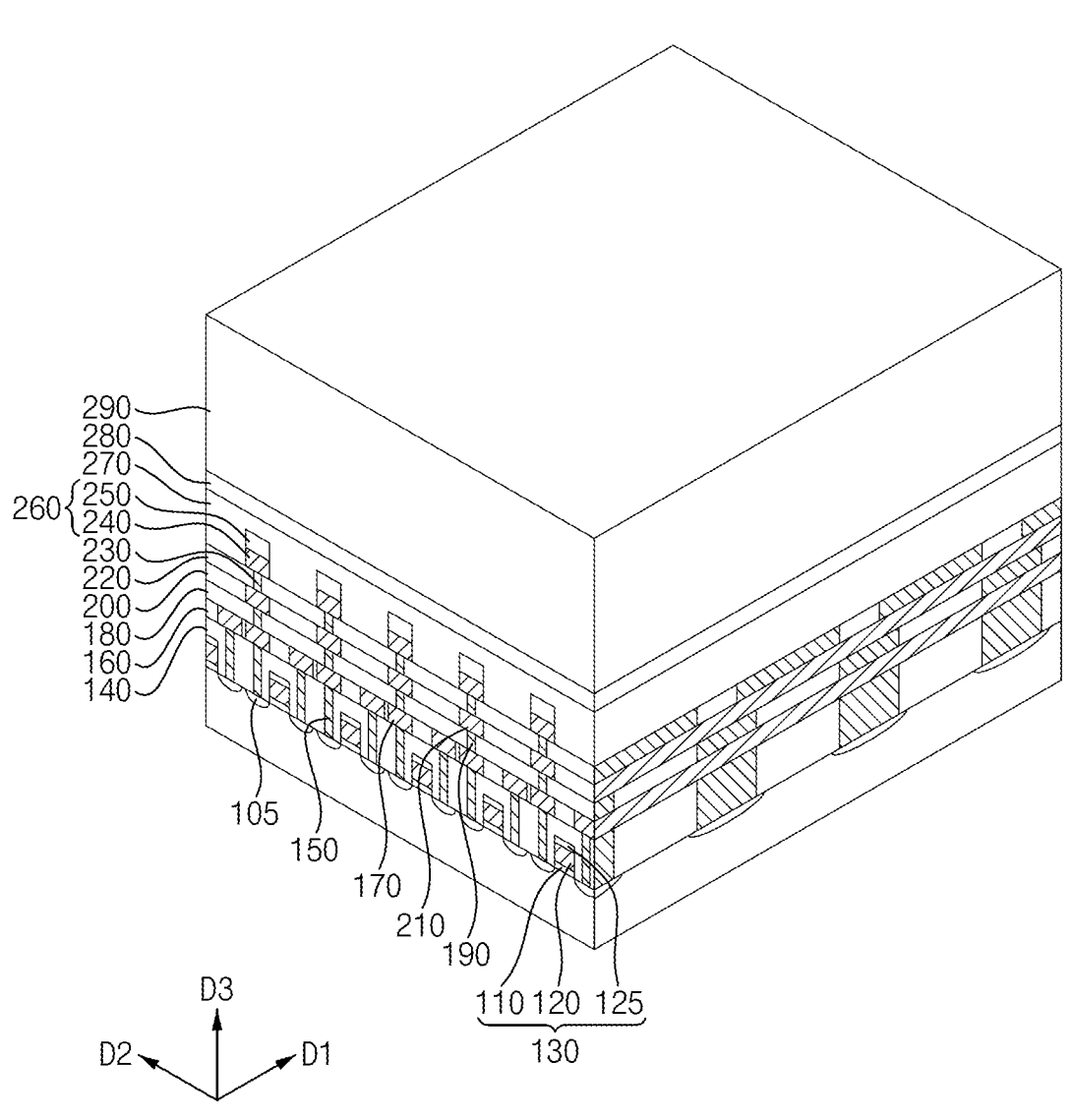

Referring to FIG. 6, a first upper insulating interlayer 270 may be formed on the fifth lower insulating interlayer 220 to cover the bit line structure 260, and a spacer layer 280 and a second upper insulating interlayer 290 may be sequentially stacked on the first upper insulating interlayer 270.

Each of the first and second upper insulating interlayers 270 and 290 may include an oxide, e.g., silicon oxide, and the spacer layer 280 may include a material having an etch selectivity with respect to the first and second upper insulating interlayers 270 and 290, e.g., an insulating nitride such as silicon nitride, polysilicon, silicon-germanium (SiGe), or the like.

Figure 7:
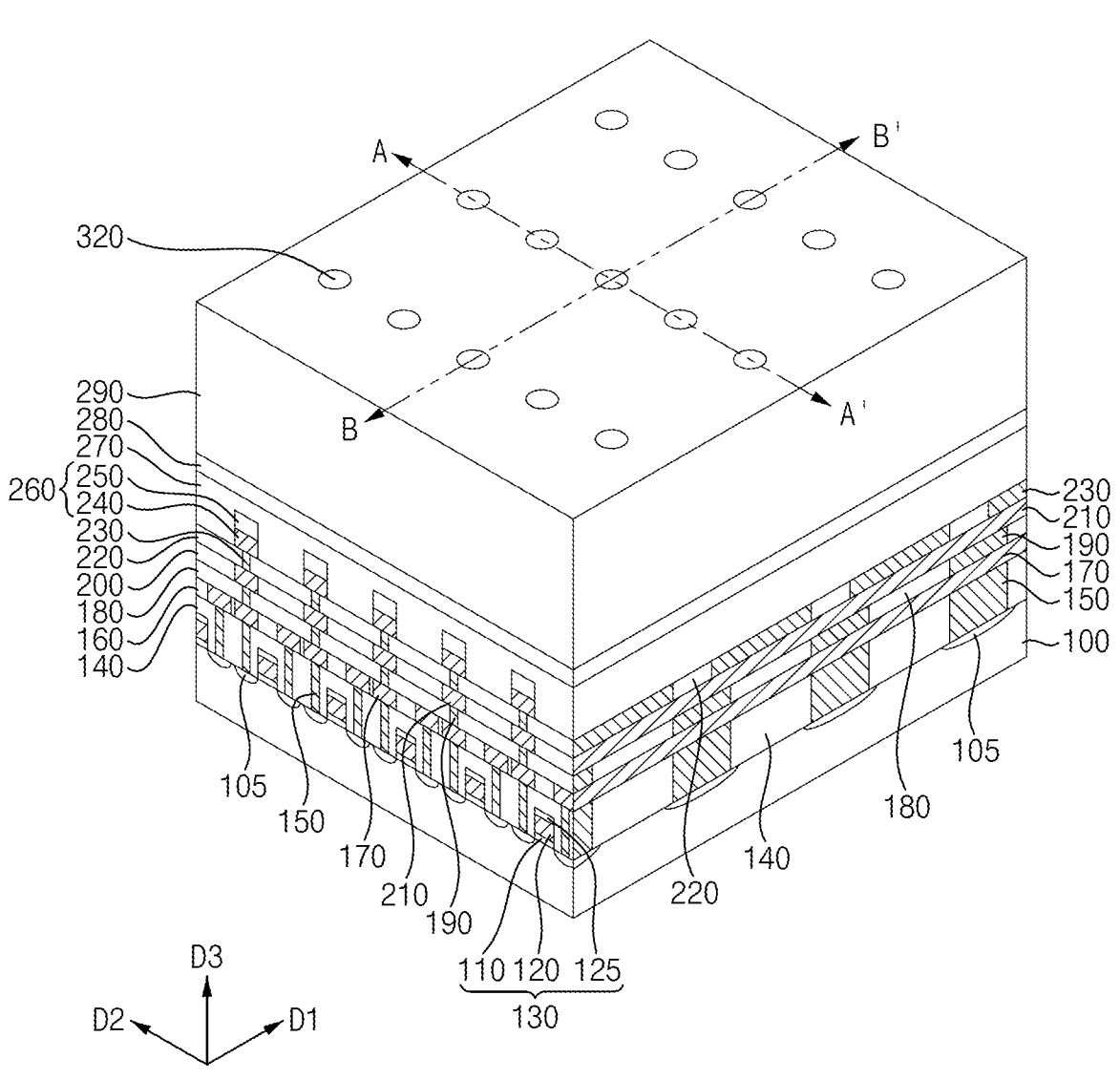
Figure 8:
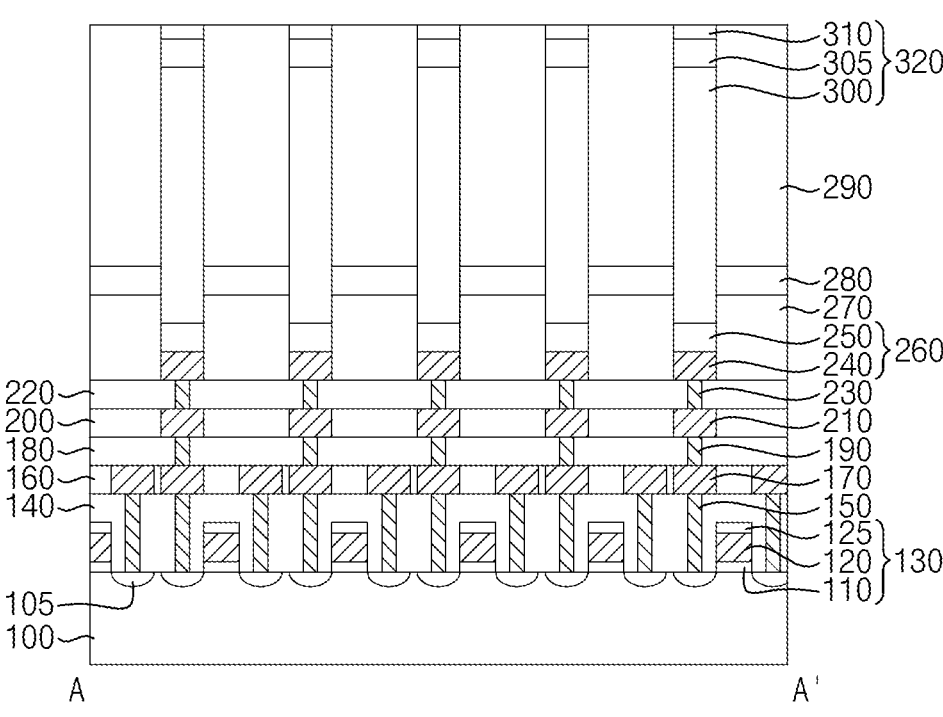
Figure 8:
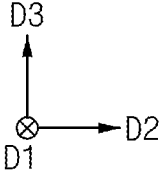
Figure 9:
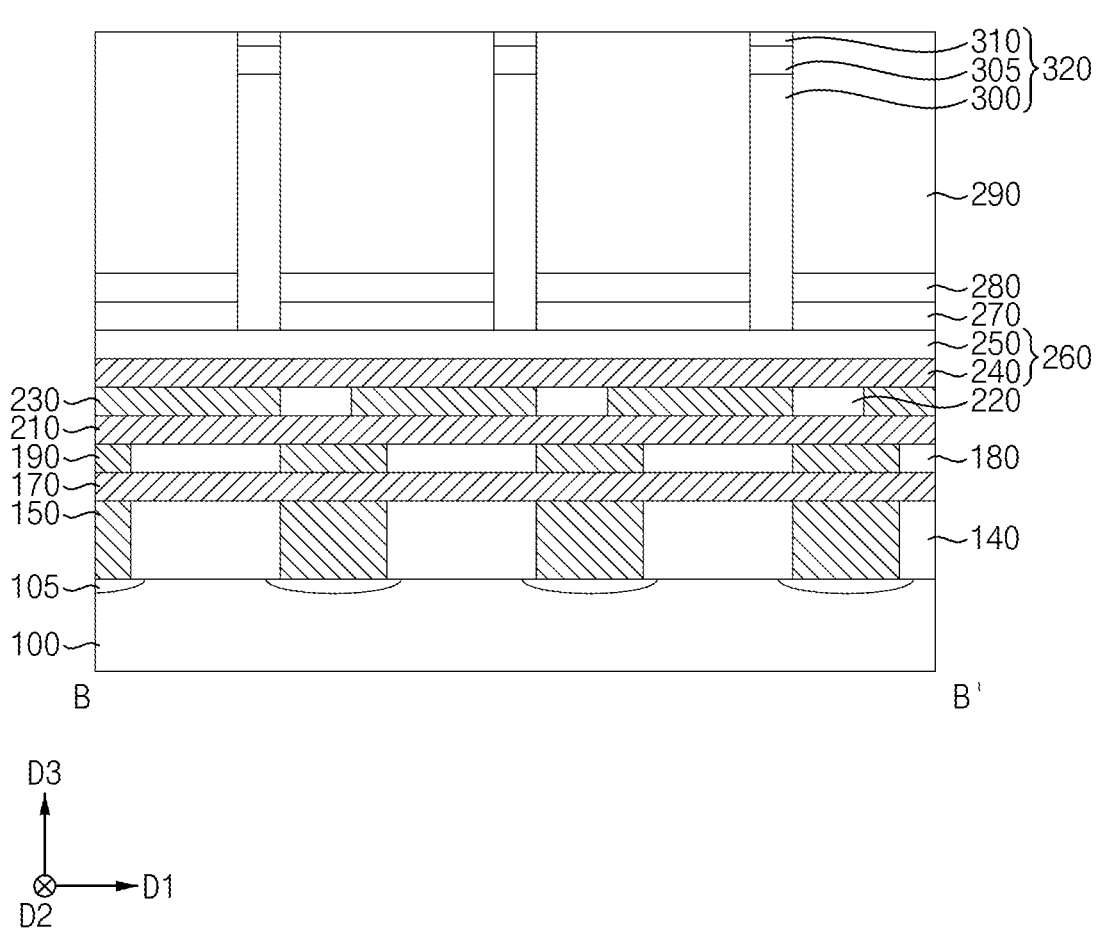

Referring to FIGS. 7 to 9, a first opening may be formed through the second upper insulating interlayer 290, the spacer layer 280 and an upper portion of the first upper insulating interlayer 270 to expose an upper surface of the bit line structure 260, and a channel 300 may be formed in the first opening.

In an implementation, the channel 300 may be formed by a deposition process, e.g., a chemical vapor deposition (CVD) process or an atomic layer deposition (ALD) process, and may include undoped polysilicon. In an implementation, the channel 300 may be formed by an epitaxial growth process using an upper surface of the second bit line 250 as a seed, and may include undoped single crystalline silicon.

An upper portion of the channel 300 may be removed to form a recess, and a second impurity region 305 may be formed on the channel 300 in the recess to include n-type or p-type impurities. In an implementation, the second impurity region 305 may be formed at an upper portion of the channel 300 by, e.g., a gas phase doping (GPD) process or an ion implantation (IIP) process. In an implementation, the second impurity region 305 may be formed as a separate layer structure on the channel 300 by a deposition process such as a chemical vapor deposition (CVD) process or an atomic layer deposition (ALD) process.

An etch stop pattern 310 may be formed on the second impurity region 305 to fill a remaining portion of the recess. The etch stop pattern 310 may be formed by forming an etch stop layer on the second impurity region 305 and the second upper insulating interlayer 290 to fill the recess, and performing a planarization process on the etch stop layer until an upper surface of the second insulating interlayer 290 is exposed. The planarization process may include, e.g., a chemical mechanical polishing (CMP) process and/or an etch back process.

The channel 300, the second impurity region 305 and the etch stop pattern 310 in the first opening, which are sequentially stacked along the third direction D3, may collectively form a pillar structure 320.

In an implementation, as illustrated in FIGS. 4 to 9, the upper portion of the channel 300 may be removed to form the recess, the second impurity region 305 may be formed on the channel 300 or at the upper portion of the channel 300, and the etch stop pattern 310 may be formed on the second impurity region 305. In an implementation, the second impurity region 305 may be formed on the channel 300 or at the upper portion of the channel 300, an upper portion of the second impurity region 305 may be removed to form a recess, and the etch stop pattern 310 may be formed in the recess.

Figure 10:
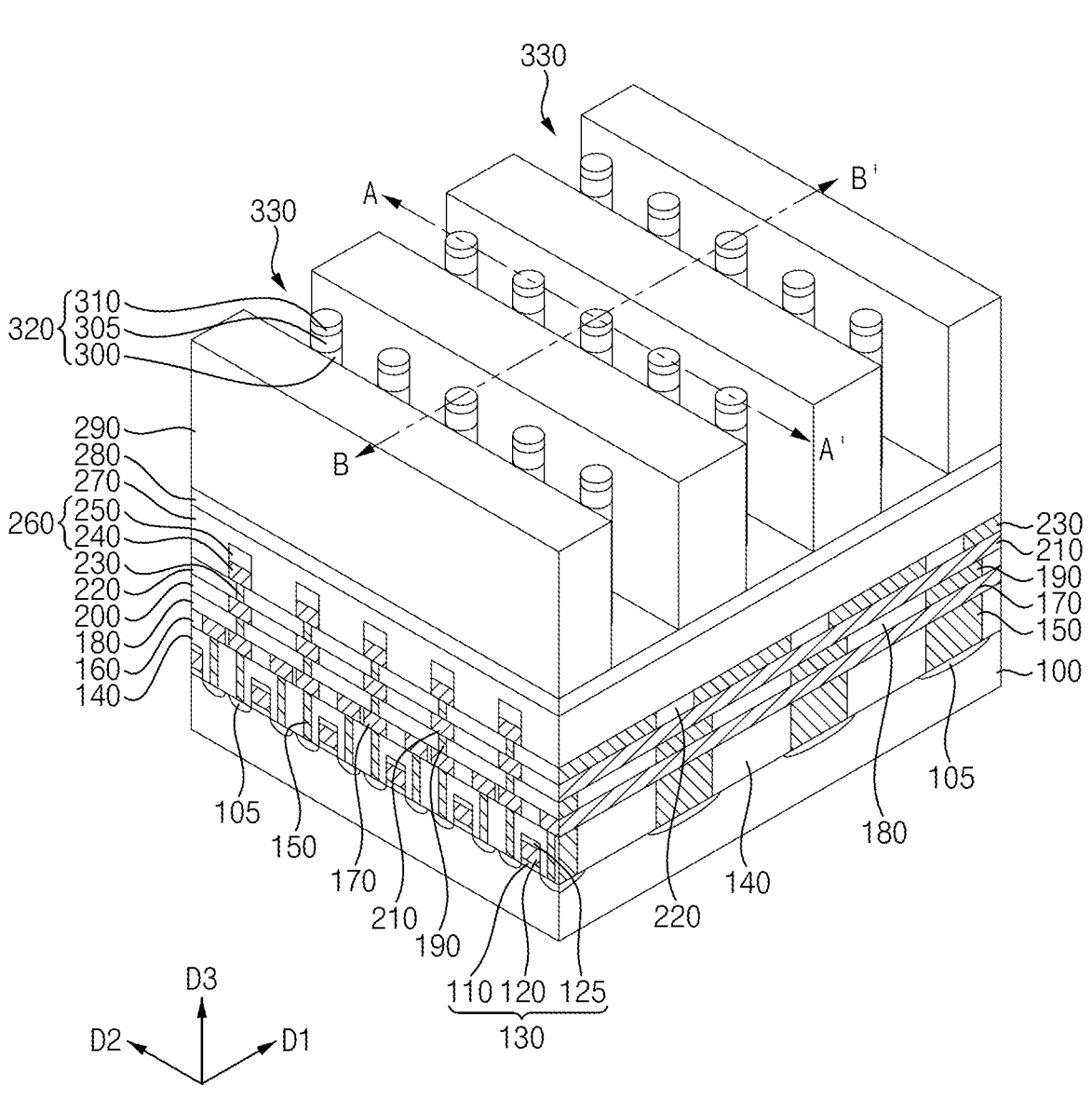
Figure 11:
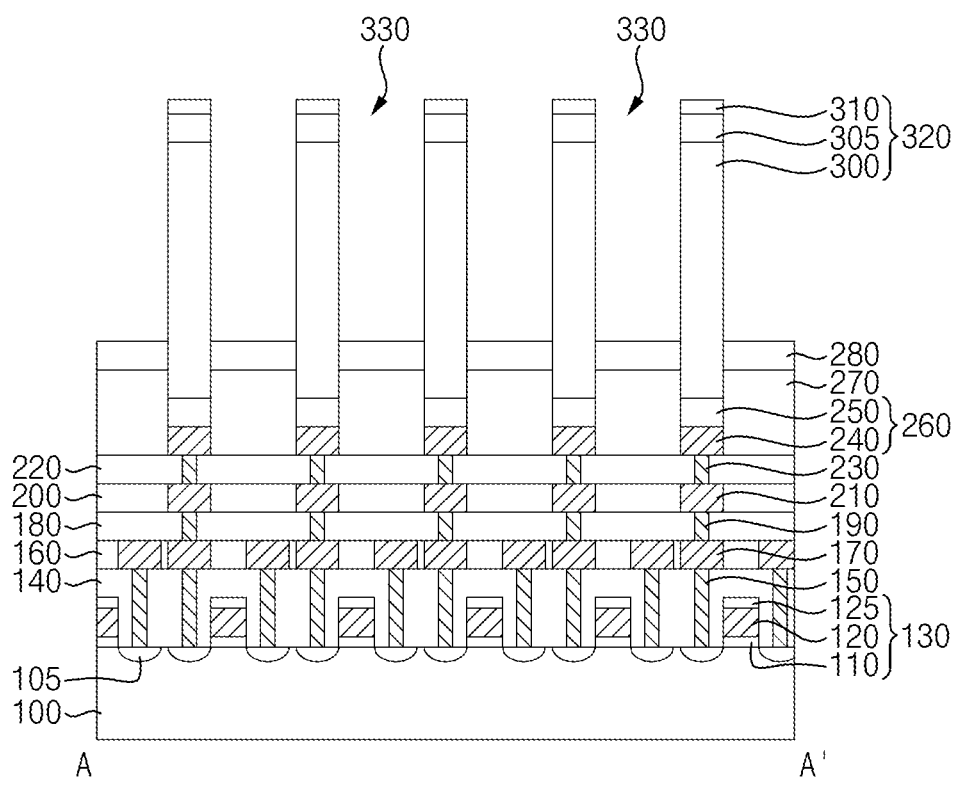
Figure 11:
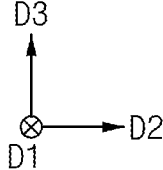
Figure 12:
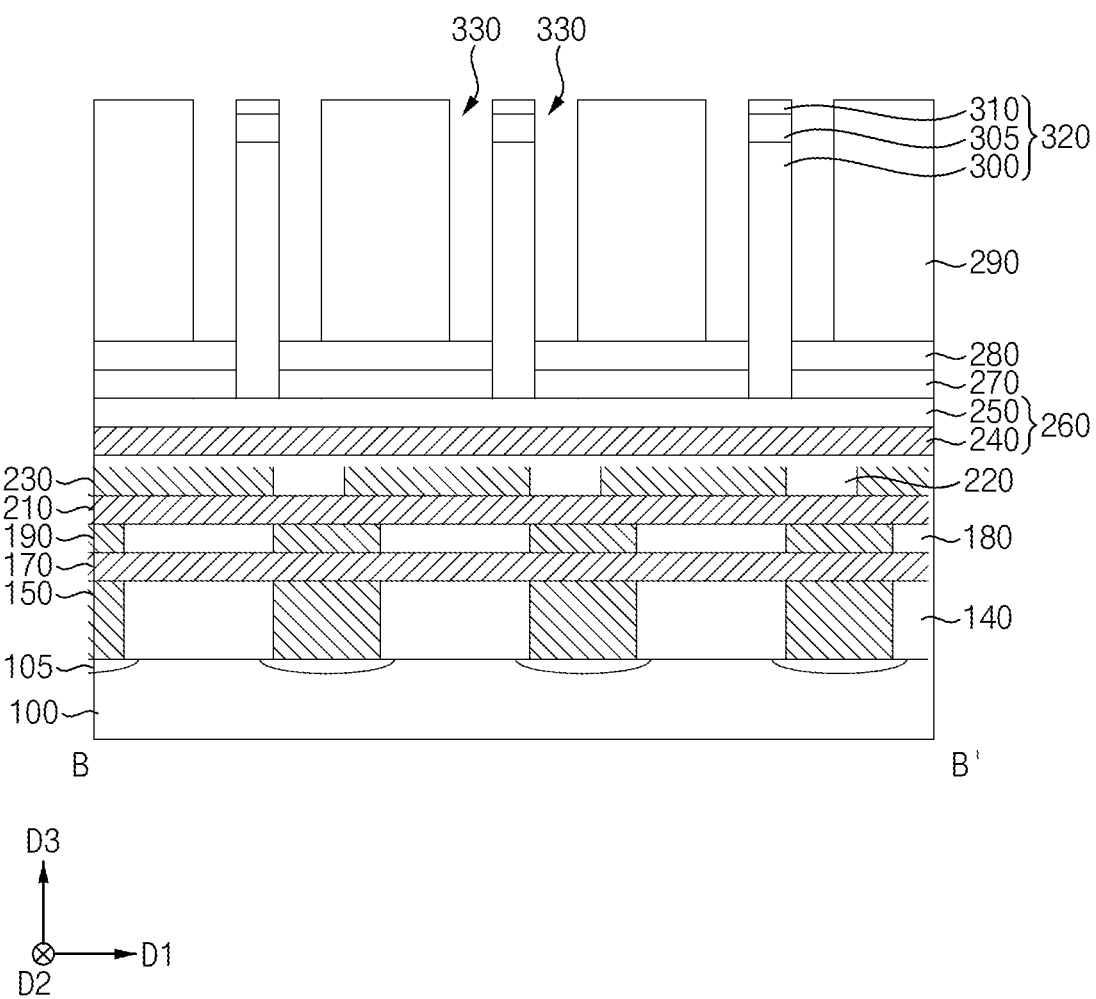

Referring to FIGS. 10 to 12, a portion of the second upper insulating interlayer 290 adjacent to the pillar structure 320 may be removed to form a second opening 330 exposing an upper surface of the spacer layer 280.

In an implementation, the second opening 330 may extend in the second direction D2, and expose an upper portion of each of the pillar structures 320 in the second upper insulating interlayer 290.

Figure 13:
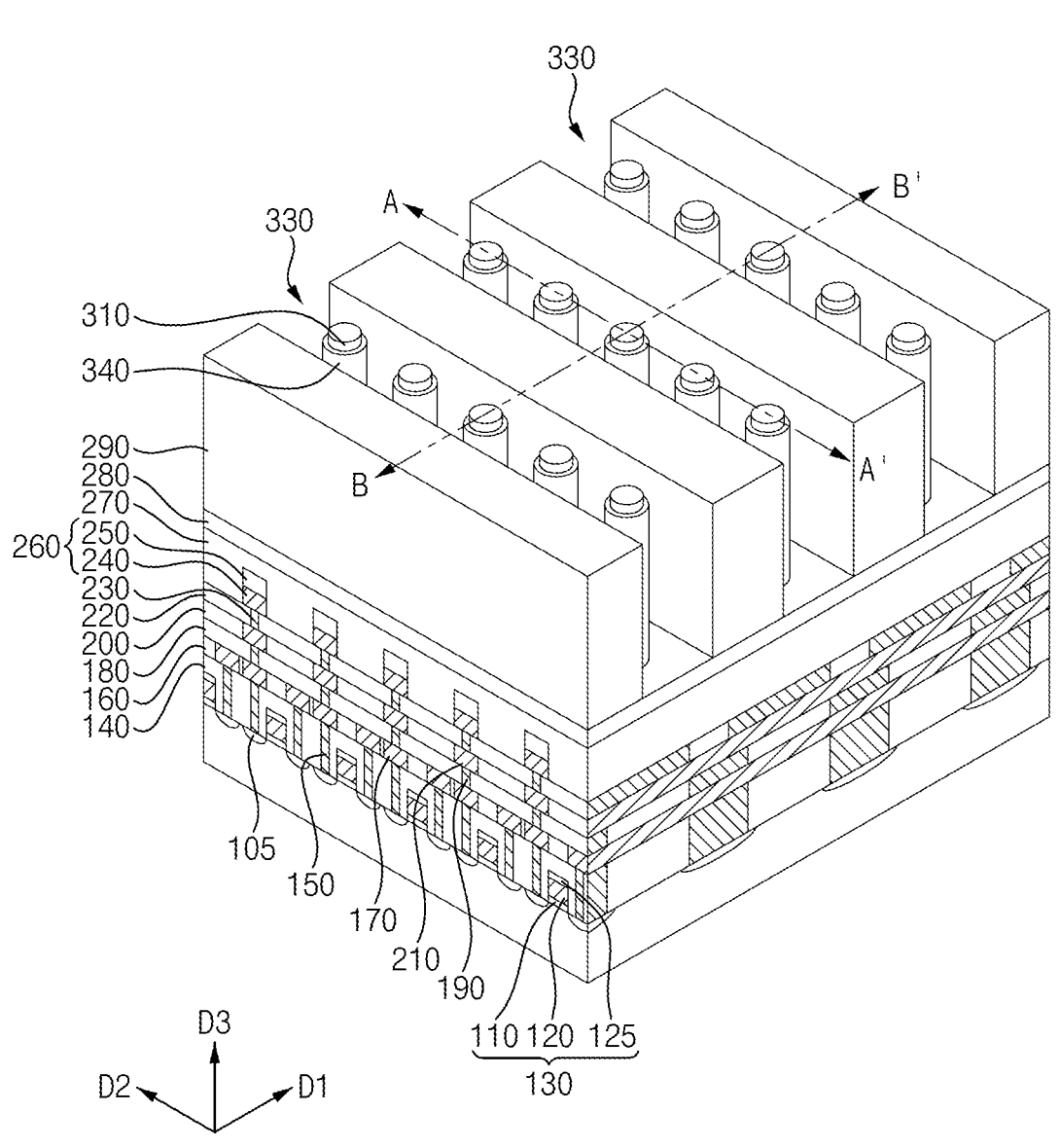
Figure 14:
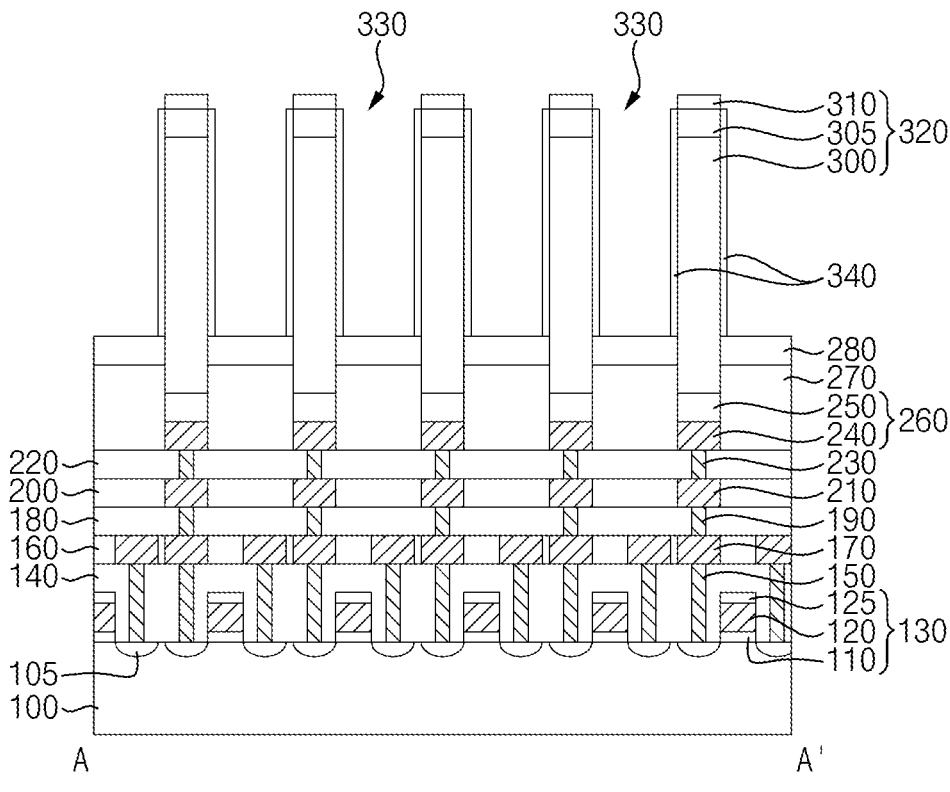
Figure 14:
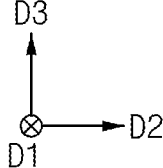
Figure 15:
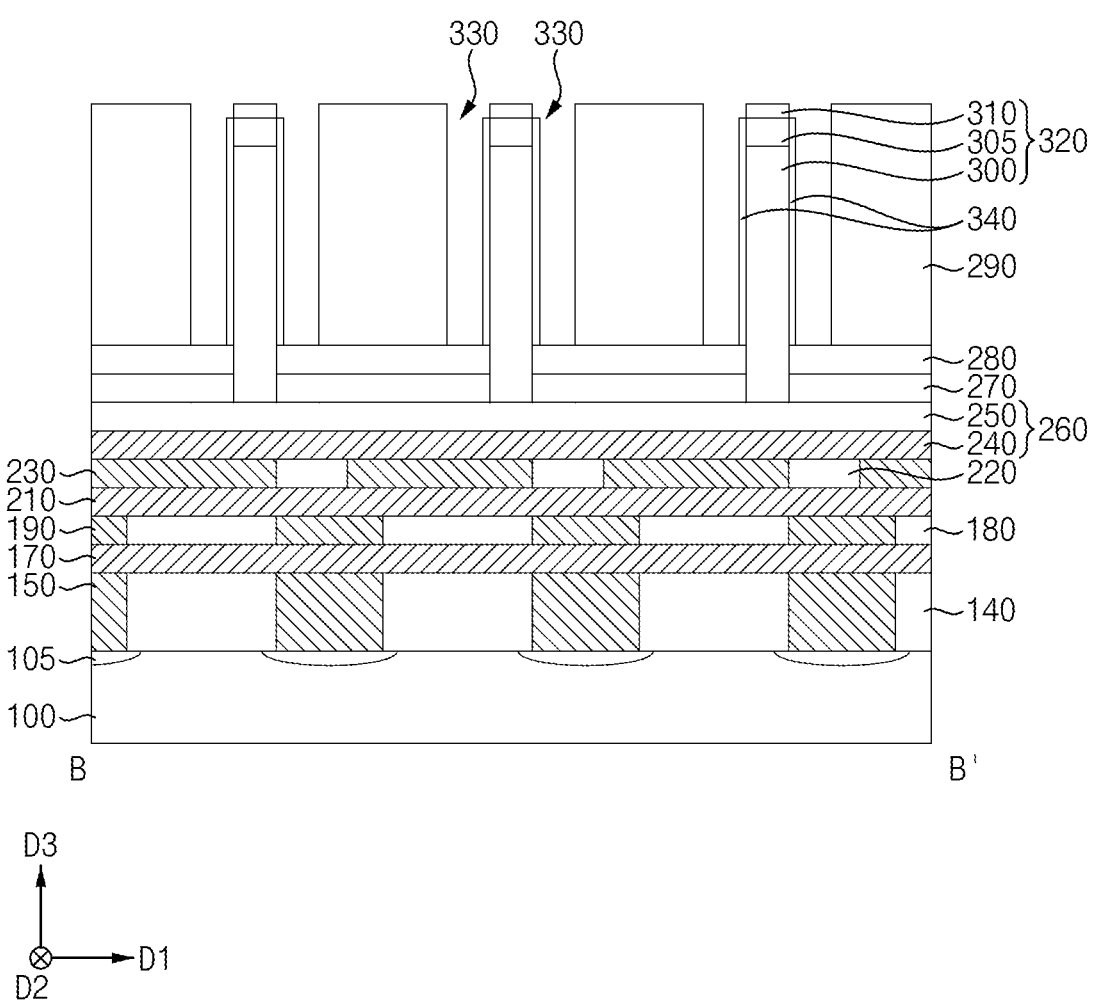

Referring to FIGS. 13 to 15, an upper gate insulation pattern 340 may be formed on a surface of the pillar structure 320 exposed by the second opening 330.

In an implementation, the upper gate insulation pattern 340 may be formed by a thermal oxidation process, e.g., sidewalls of the channel 300 and the second impurity region 305 including silicon may be oxidized to form the upper gate insulation pattern 340. In an implementation, the upper gate insulation pattern 340 may be formed on a sidewall of each of the channel 300 and the second impurity region 305, and may include, e.g., silicon oxide.

Figure 16:
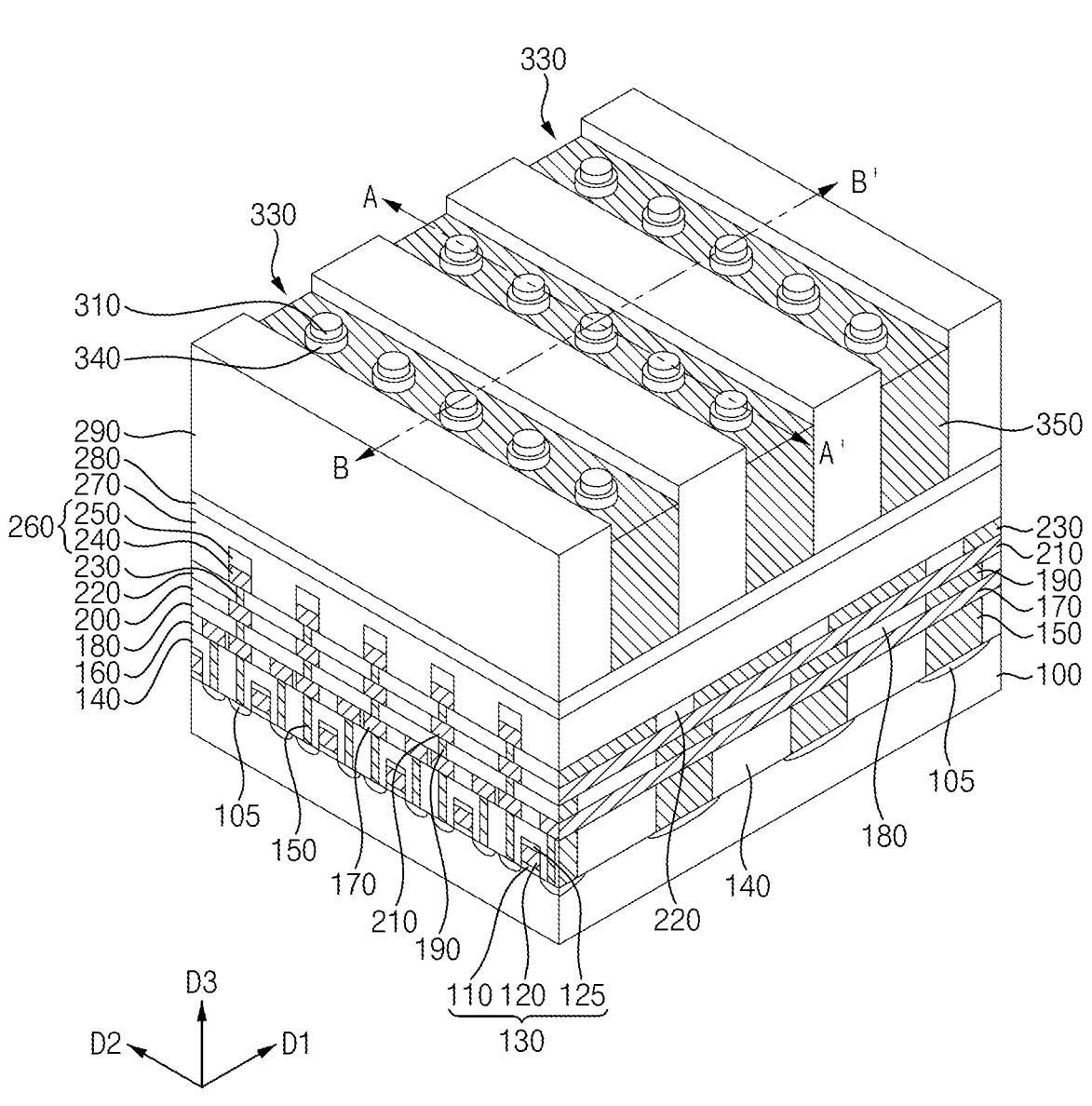
Figure 17:
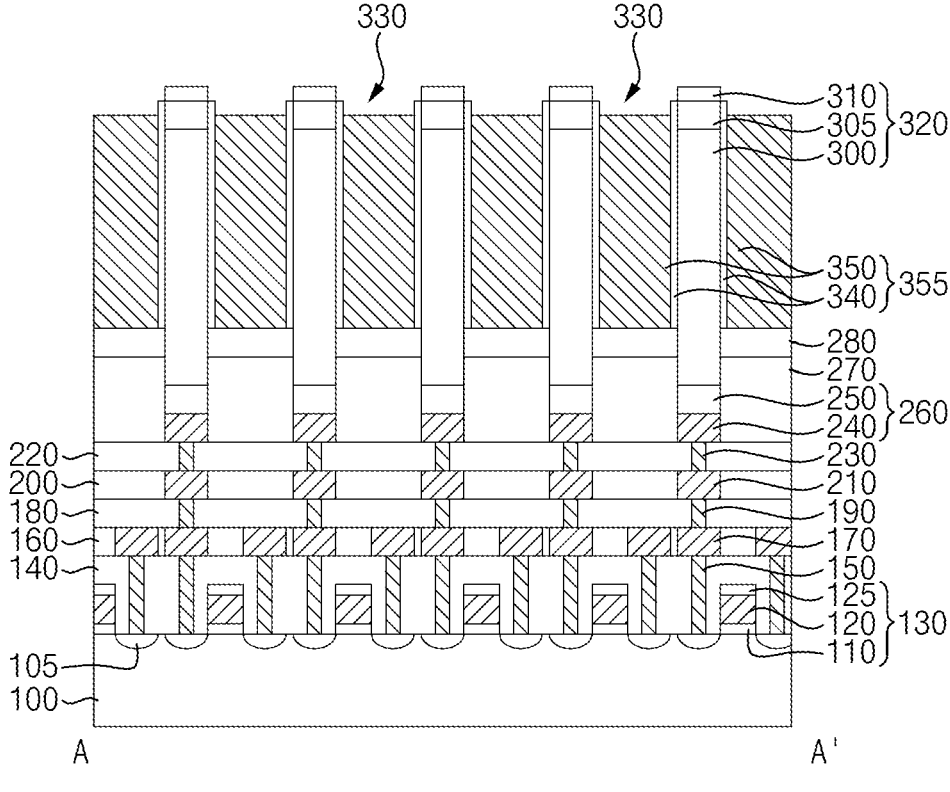
Figure 17:
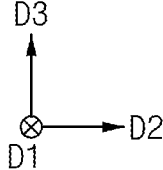
Figure 18:
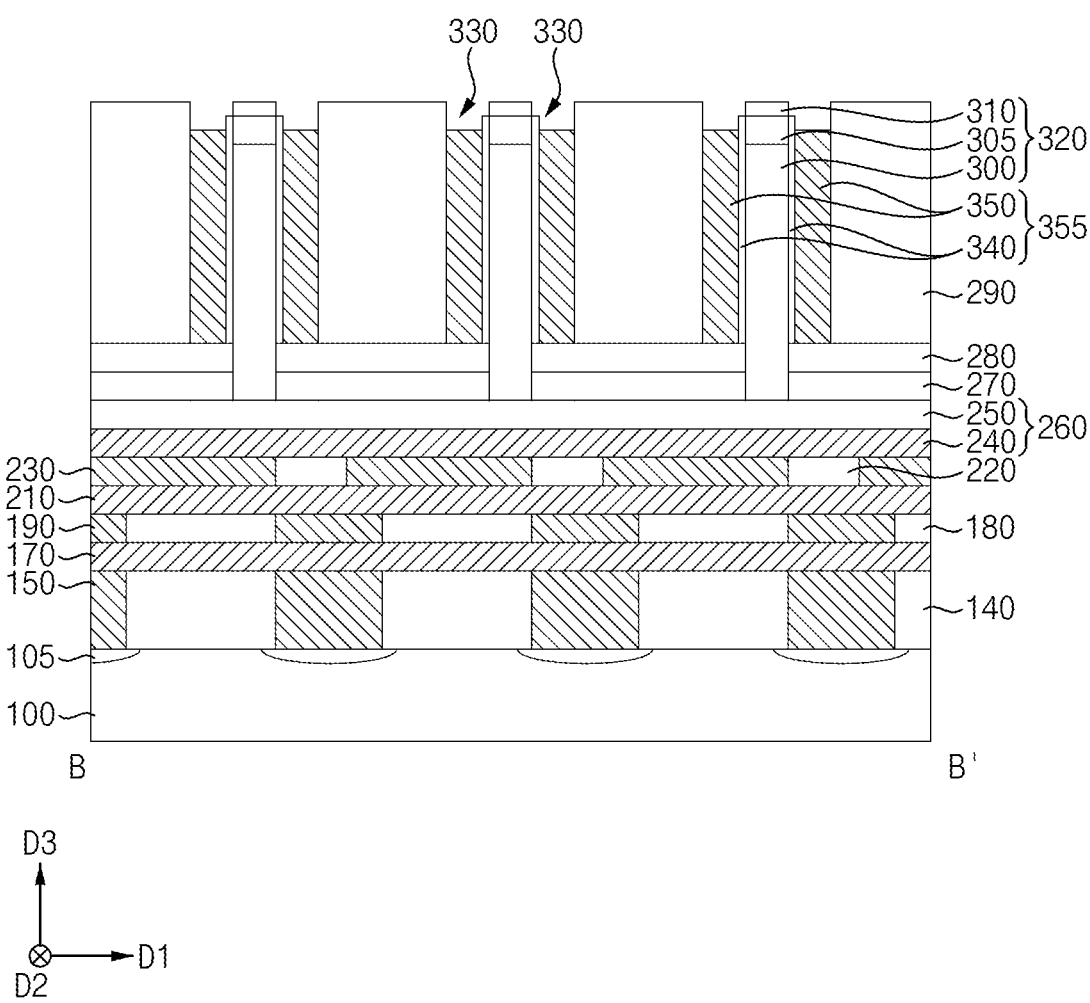

Referring to FIGS. 16 to 18, an upper gate electrode layer may be formed on the spacer layer 280, the pillar structure 320, the upper gate insulation pattern 340, and the second upper insulating interlayer 290 to fill the second opening 330, and an upper portion of the upper gate electrode layer may be removed by, e.g., a CMP process or an etch-back process to form an upper gate electrode 350 in the second opening 330.

In an implementation, the upper gate electrode 350 may extend in the second direction D2, and a plurality of upper gate electrodes 350 may be spaced apart from each other in the first direction D1. Each of the upper gate electrodes 350 may surround upper portions of the pillar structures 320 disposed in the second direction D2, and may cover the upper gate insulation patterns 340 on sidewalls of the pillar structures 320. The upper gate electrode 350 and the upper gate insulation pattern 340 may collectively form an upper gate structure 355.

In an implementation, an upper surface of the upper gate electrode 350 may be lower than an upper end of the second opening 330. In an implementation, the upper surface of the upper gate electrode 350 may be lower than an upper surface of the upper gate insulation pattern 340.

Figure 19:
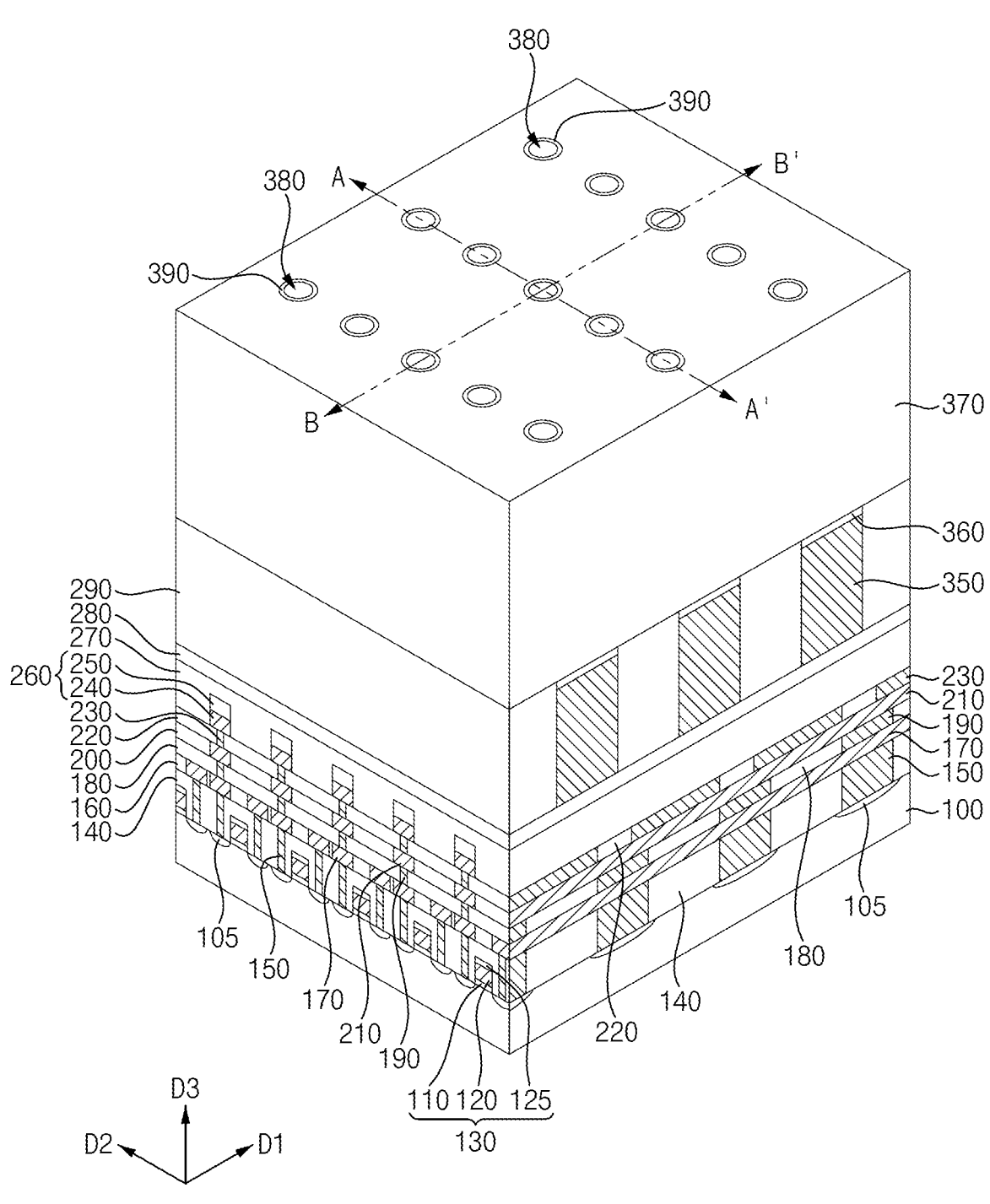
Figure 20:
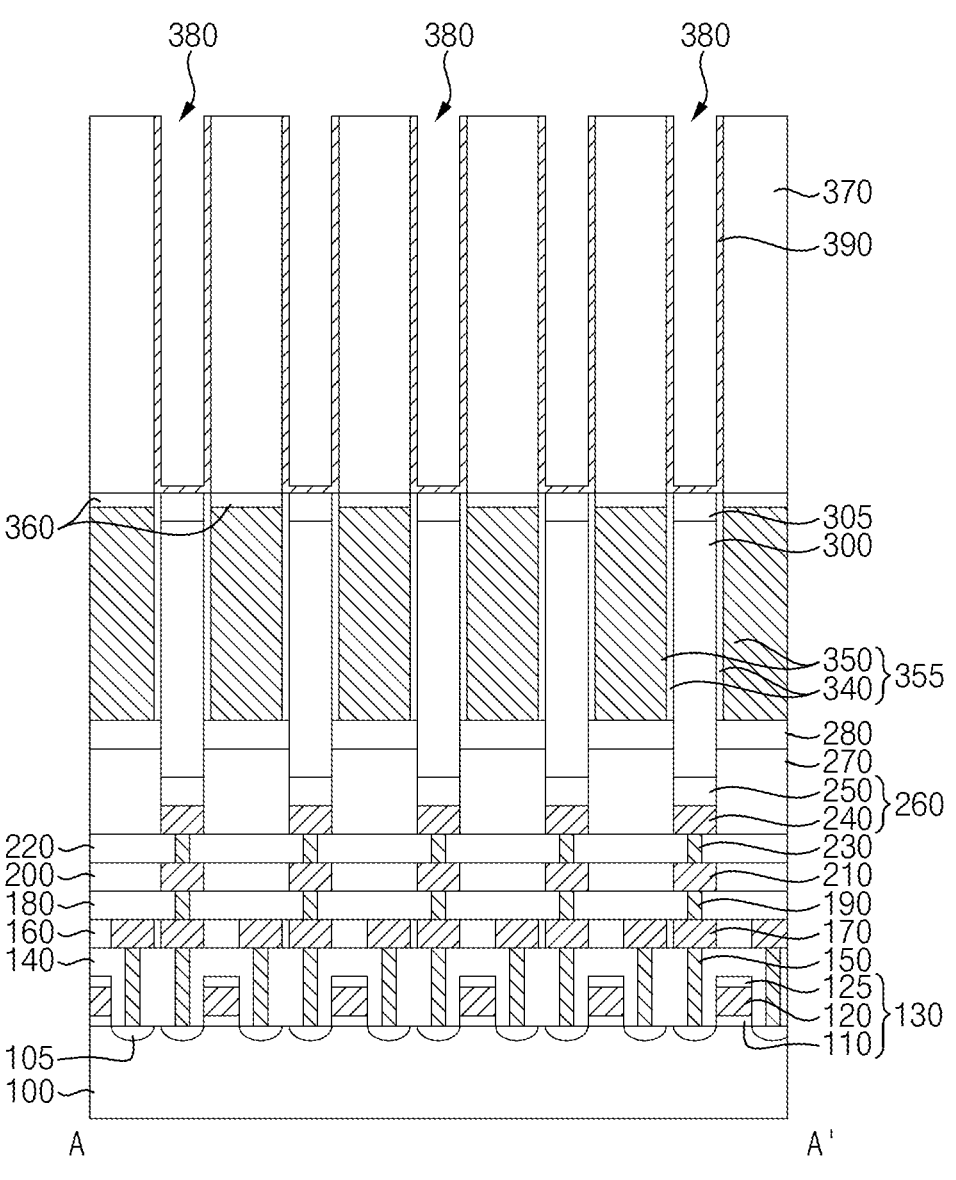
Figure 20:
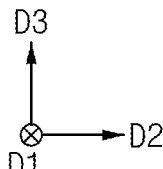
Figure 21:
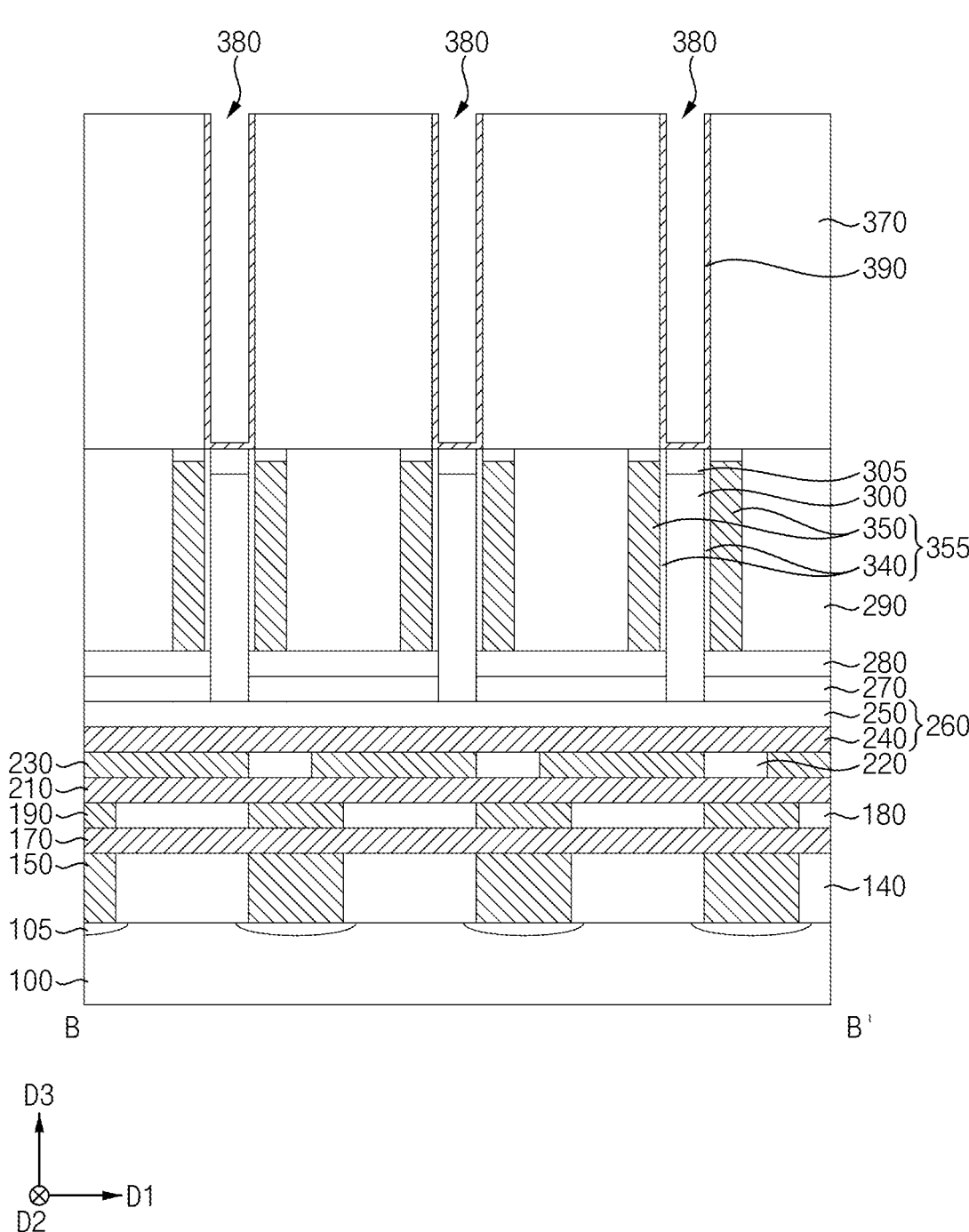

Referring to FIGS. 19 to 21, a first insulation layer may be formed on the upper gate structure 355, the etch stop pattern 310 and the second upper insulating interlayer 290 to fill a remaining portion of the second opening 330, and a planarization process may be performed on the first insulation layer until an upper surface of the second impurity region 305 is exposed to form a first insulation pattern 360 filling an upper portion of the second opening 330.

During the planarization process, the etch stop pattern 310 may be removed, and a height of the upper surface of the second upper insulating interlayer 290 may be reduced.

A third upper insulating interlayer 370 may be formed on the second upper insulating interlayer 290, the first insulation pattern 360, the second impurity region 305 and the upper gate structure 355, and a third opening 380 may be formed through the third upper insulating interlayer 370 to expose the upper surface of the second impurity region 305. In an implementation, a plurality of third openings 380 may be spaced apart from each other in the first and second directions D1 and D2. In an implementation, after the third opening 380 is formed, an etching process may be additionally performed on the third upper insulating interlayer 370 to increase a width of the third opening 380 in the horizontal direction.

A first capacitor electrode layer may be formed on the upper surface of the second impurity region 305, a sidewall of the third opening 380, and an upper surface of the third upper insulating interlayer 370 exposed by the third opening 380, and a portion of the first capacitor electrode layer on the upper surface of the third upper insulating interlayer 370 may be removed to form a first capacitor electrode 390.

Figure 22:
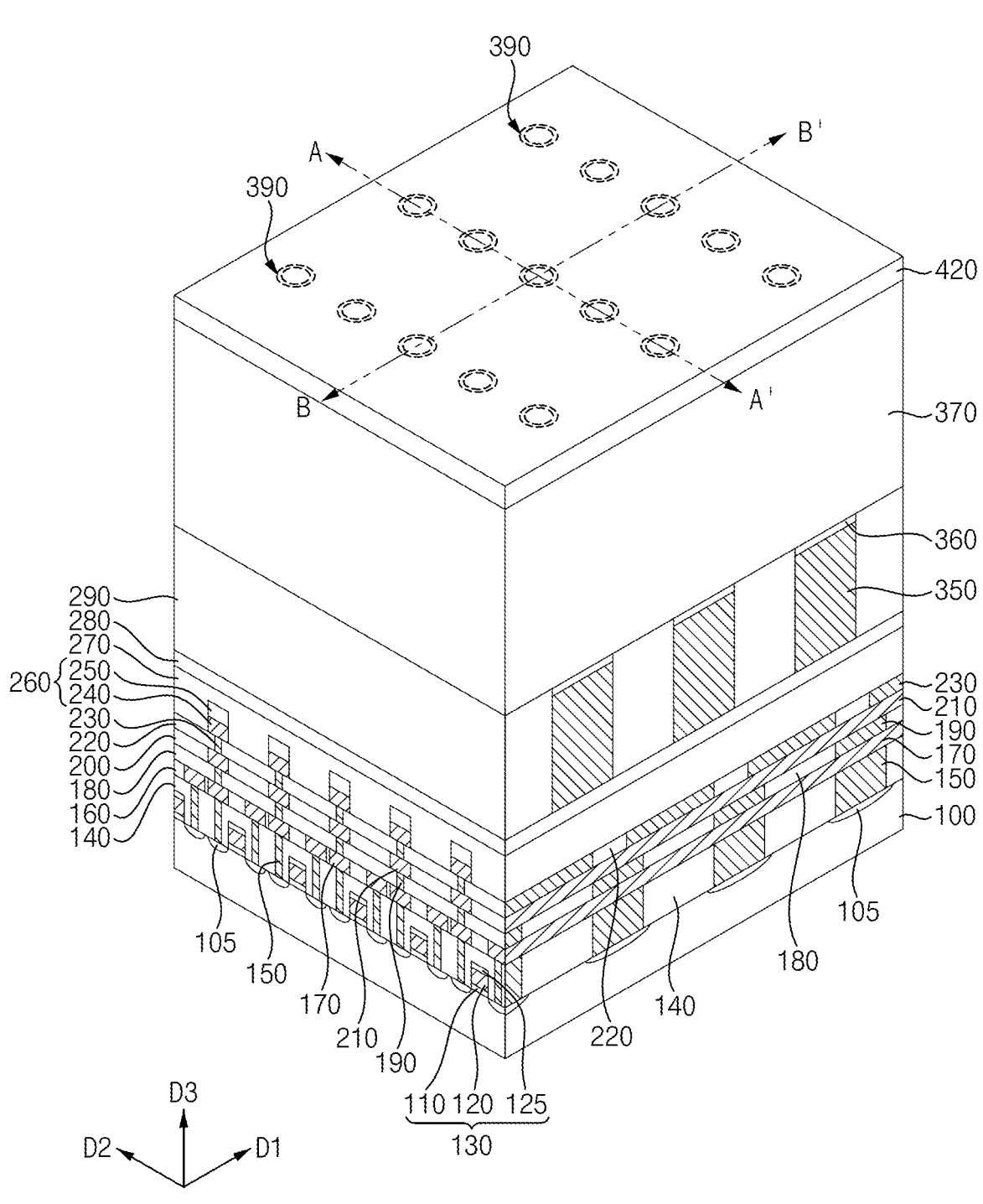
Figure 23:
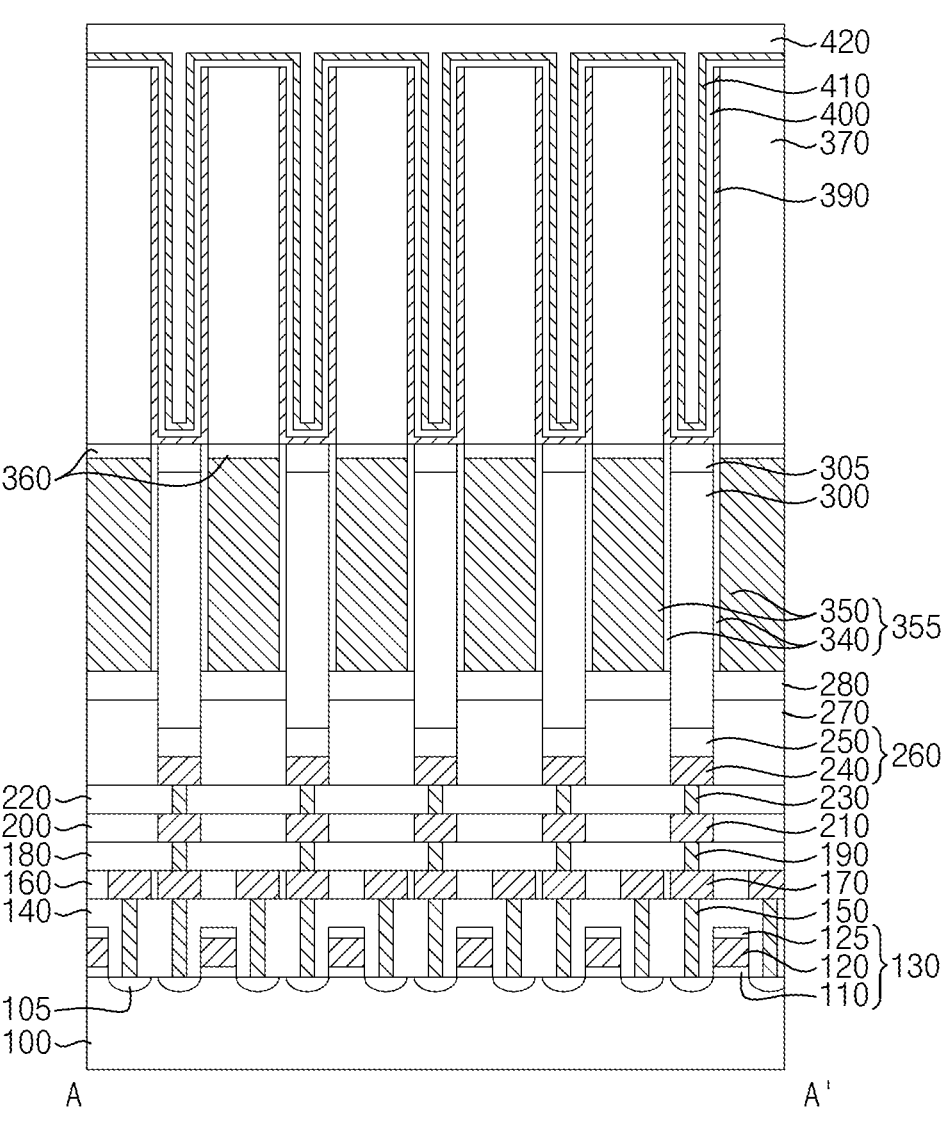
Figure 23:
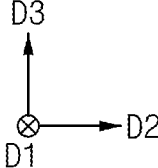
Figure 24:
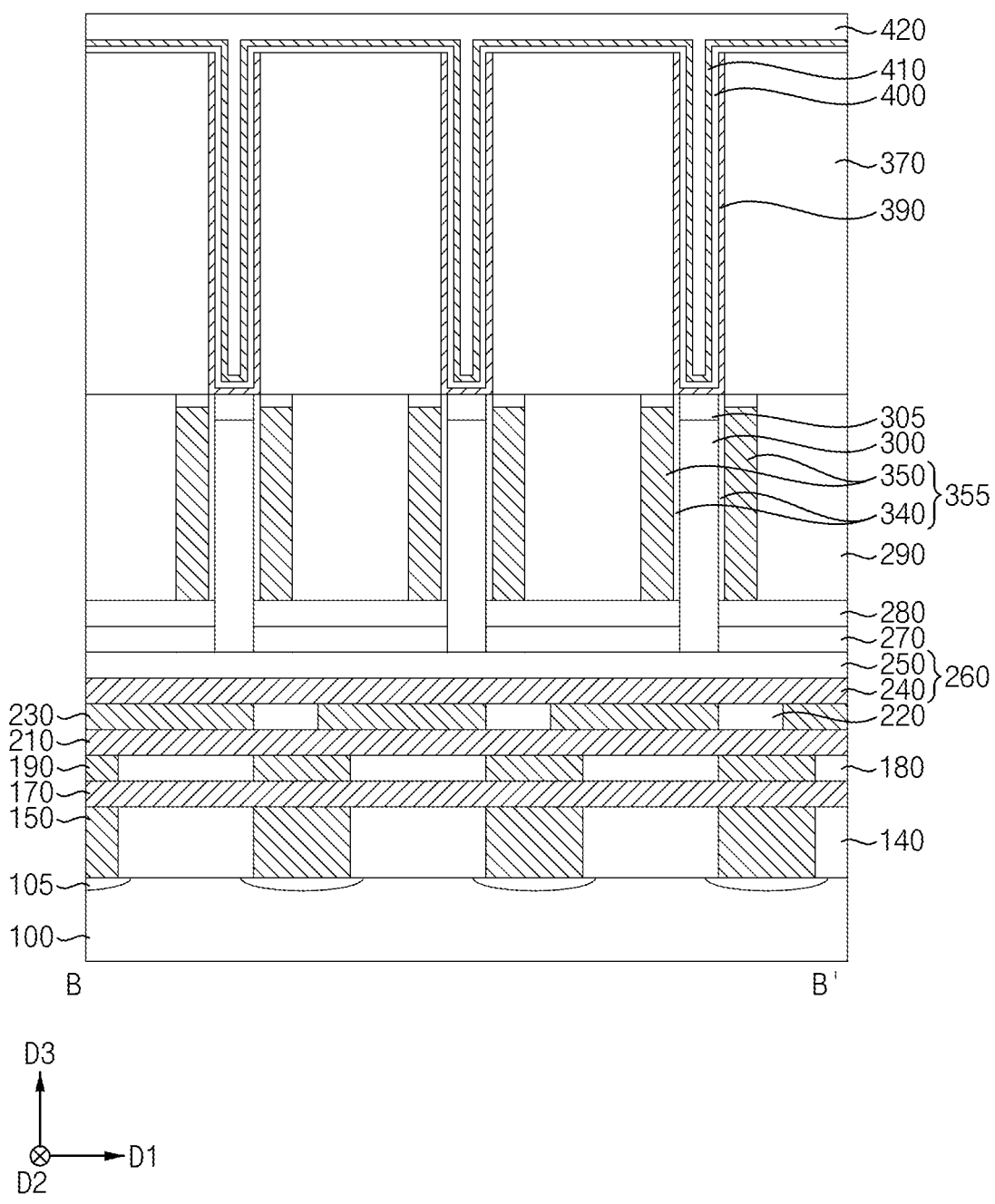

Referring to FIGS. 22 to 24, a dielectric layer 400 and a second capacitor electrode 410 may be sequentially stacked on the first capacitor electrode 390 and the third upper insulating interlayer 370, and a capacitor plate electrode layer 420 may be formed on the second capacitor electrode 410 to fill the third opening 380.

In an implementation, each of the dielectric layer 400 and the second capacitor electrode 410 may be conformally formed, and the capacitor plate electrode layer 420 may also be formed on portions of the dielectric layer 400 and the second capacitor electrode 410 on the upper surface of the third insulating interlayer 370 so that an upper surface of the capacitor plate electrode 410 may be higher than the upper surface of the third insulating interlayer 370.

Referring back to FIGS. 1 to 3, a fourth opening may be formed through the capacitor plate electrode layer 420 to expose an upper surface of the second capacitor electrode 410, and the second insulation pattern 430 may be formed in the fourth opening.

In an implementation, the second insulation pattern 430 may extend in the second direction D2, and a plurality of second insulation patterns 430 may be spaced apart from each other in the first direction D1.

As the second insulation pattern 430 is formed, the capacitor plate electrode layer 420 may be divided into capacitor plate electrodes 425, each of which may extend in the second direction D2, spaced apart from each other in the first direction D1. In an implementation, each of the capacitor plate electrodes 425 may overlap a corresponding one of the upper gate electrodes 350 in the third direction D3. The first capacitor electrode 390, the dielectric layer 400, the second capacitor electrode 410, and the capacitor plate electrode 425 may collectively form a capacitor structure 440.

Manufacturing of the semiconductor device may be completed by performing the processes described above.

Figure 25:
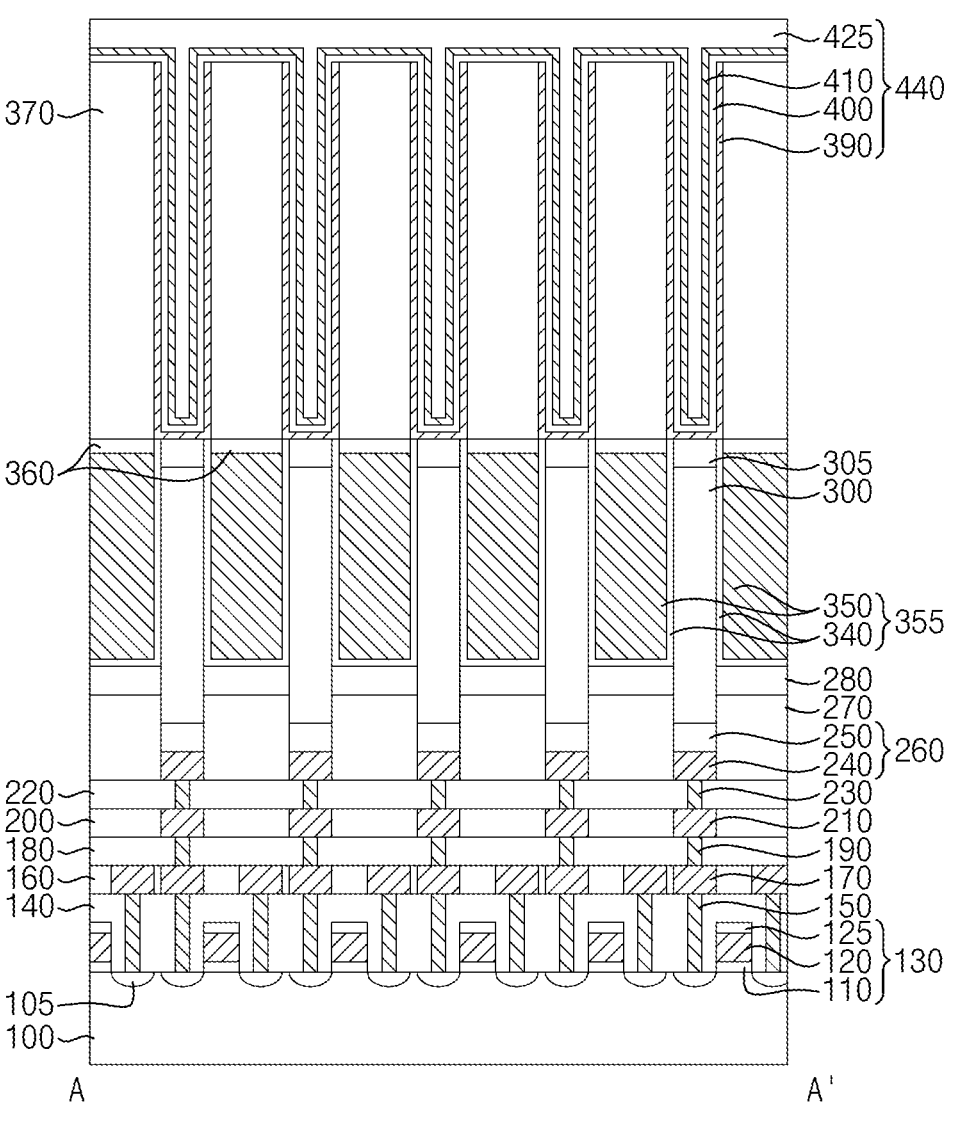
FIG. 25 is a cross-sectional view illustrating a semiconductor device in accordance with example embodiments.
Figure 25:
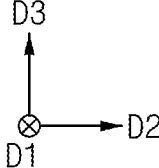

FIG. 25 is a cross-sectional view illustrating a semiconductor device according to example embodiments, which may correspond to FIG. 2.

This semiconductor device may be substantially the same as or similar to that of FIGS. 1 to 3, except for some components, and repeated explanations may be omitted herein.

Referring to FIG. 25, the upper gate insulation pattern 340 may be formed not only on the sidewall of the channel 300, but also on an upper surface of the spacer layer 280, and thus the upper gate insulation patterns 340 disposed in the second direction D2 may be connected to each other.

In an implementation, the spacer layer 280 may include polysilicon, and during the formation of the upper gate insulation pattern 340 by a thermal oxidation process, the upper gate insulation pattern 340 may be formed not only on the sidewall of the channel 300 but also the upper surface of the spacer layer 280 including silicon.

In an implementation, the upper gate insulation pattern 340 may be formed by a deposition process such as a chemical vapor deposition (CVD) process or an atomic layer deposition (ALD) process instead of the thermal oxidation process, and the gate insulation pattern 340 may also be formed on the upper surface of the spacer layer 280.

Figure 26:
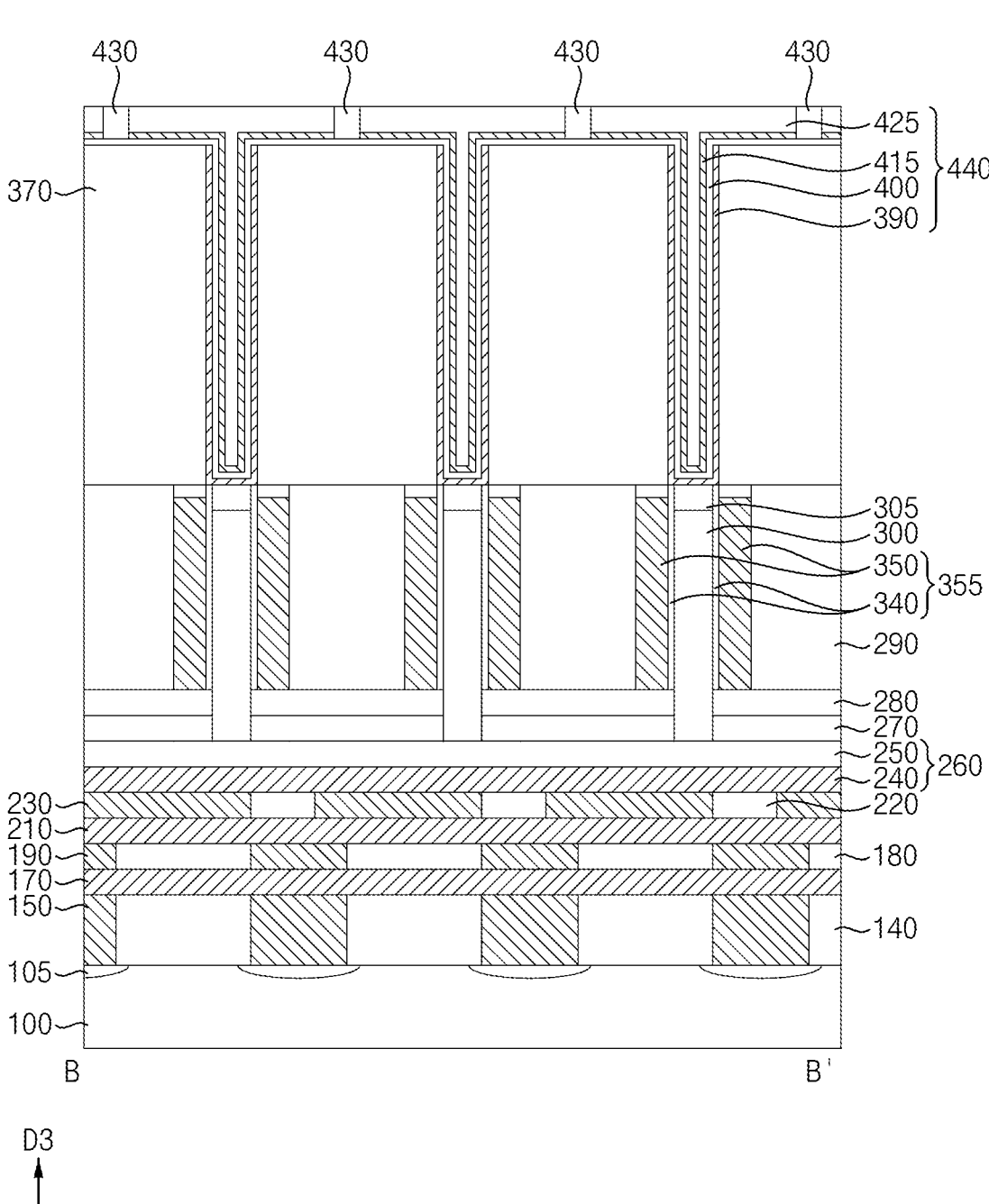
FIGS. 26 and 27 are cross-sectional views illustrating a semiconductor device in accordance with example embodiments.
Figure 27:
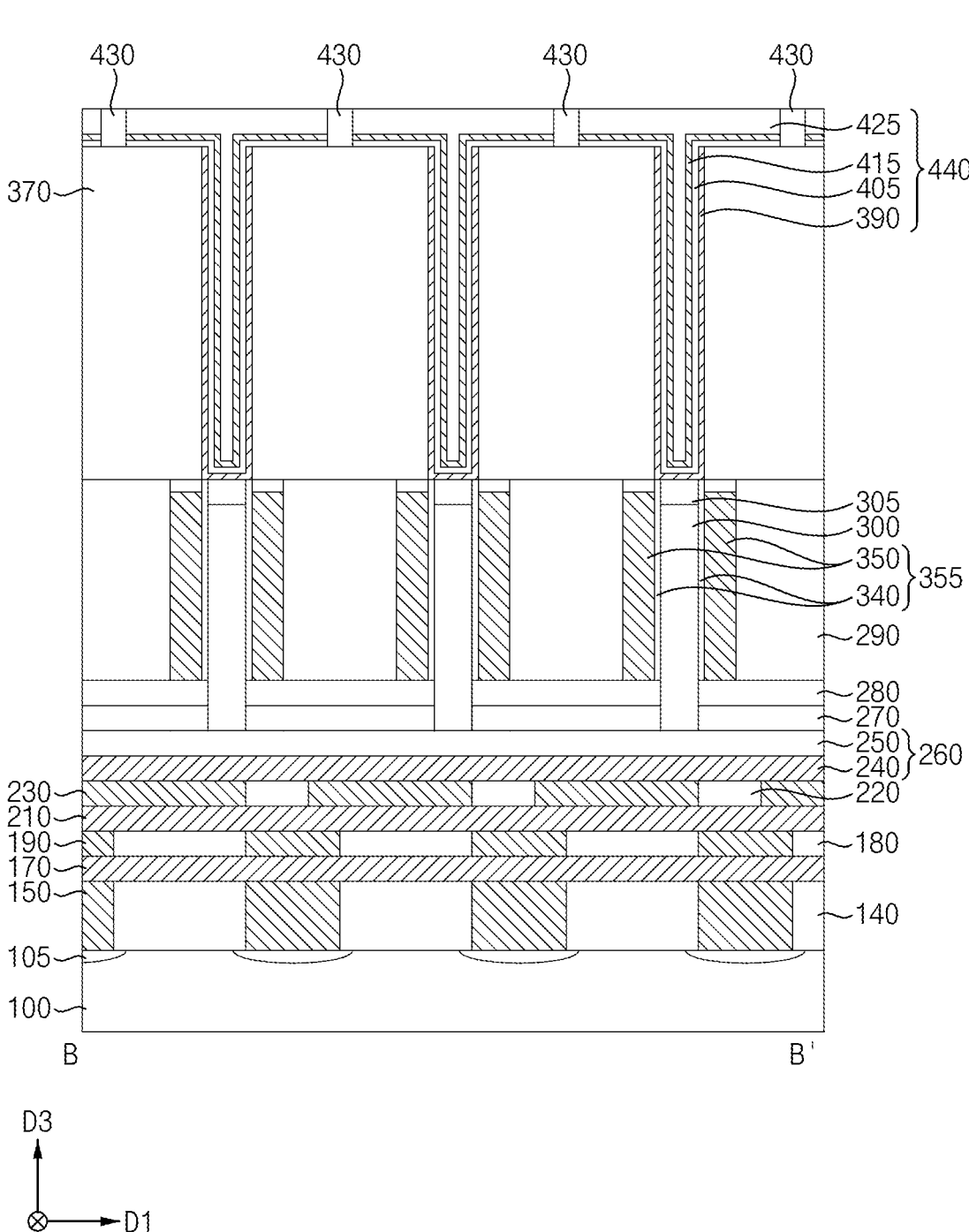

FIGS. 26 and 27 are cross-sectional views illustrating semiconductor devices according to example embodiments, which may correspond to FIG. 3.

These semiconductor devices may be substantially the same as or similar to that of FIGS. 1 to 3, except for some components, and repeated explanations may be omitted herein.

Referring to FIG. 26, the second insulation pattern 430 may extend through not only the capacitor plate electrode 425, but also the second capacitor electrode 410, and thus the second capacitor electrode 410 may be divided into a plurality of second capacitor electrodes 415 spaced apart from each other in the first direction D1.

Referring to FIG. 27, the second insulation pattern 430 may extend through not only the capacitor plate electrode 425, but also the second capacitor electrode 410 and the dielectric layer 400, and thus the dielectric layer 400 may be divided into a plurality of dielectric patterns 405 spaced apart from each other in first direction D1.

By way of summation and review, a channel electrically connected to the capacitor structure may have low leakage current characteristics, and a capacitor electrode contacting the dielectric layer may have a large area so as to have an increased retention time. Accordingly, an upper surface of the capacitor electrode may have a large height, and thus processes for forming the capacitor structure could become more difficult.

One or more embodiments may provide a semiconductor device having improved electrical characteristics.

In the semiconductor device according to example embodiments, the capacitor structure may have a dielectric layer including a ferroelectric material or an anti-ferroelectric material instead of a dielectric layer including a paraelectric material, which may have non-volatile characteristics. Thus, the channel electrically connected to the capacitor structure may include polysilicon or an oxide semiconductor material instead of single crystalline silicon having a low leakage current characteristic. Accordingly, the channel may not be on a substrate including single crystalline silicon, and thus the semiconductor device may have a COP structure in which a peripheral circuit pattern is formed between the substrate and a cell array including the channel.

The dielectric layer may have a non-volatile characteristic, and thus the capacitor structure may have an increased retention time. Thus, the capacitor electrode contacting the dielectric layer may not have a large area, and the upper surface of the capacitor electrode may not have a large height. Accordingly, the difficulty of the process of forming the capacitor electrode may be reduced.

Furthermore, the capacitor structure may include a plurality of capacitor plate electrodes spaced apart from each other, and thus different voltages may be applied to the plurality of capacitor plate electrodes. Accordingly, the performance of the capacitor structure may be easily adjusted.

Example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   bit line structures on the substrate, the bit line structures each extending in a first direction substantially parallel to an upper surface of the substrate and being spaced apart from each other in a second direction substantially parallel to the upper surface of the substrate and crossing the first direction;
   channels contacting upper surfaces of the bit line structures and being spaced apart from each other in the first and second directions;
   upper gate structures each extending in the second direction and surrounding the channels disposed in the second direction, the upper gate structures being spaced apart from each other in the first direction; and
   a capacitor structure, the capacitor structure including:
      first capacitor electrodes respectively on the channels;
      a dielectric layer on the first capacitor electrodes, the dielectric layer including a ferroelectric material or an anti-ferroelectric material;
      a second capacitor electrode layer on the dielectric layer; and
      capacitor plate electrodes on the second capacitor electrode layer, the capacitor plate electrodes each extending in the second direction and being spaced apart from each other in the first direction.

2. The semiconductor device according to claim 1, wherein each of the capacitor plate electrodes overlaps a corresponding one of the upper gate structures in a third direction substantially perpendicular to the upper surface of the substrate.

3. The semiconductor device according to claim 1, wherein:
   each of the first capacitor electrodes and the second capacitor electrode layer includes a metal or a metal nitride, and
   each of the capacitor plate electrodes includes silicon-germanium doped with an impurity.

4. The semiconductor device according to claim 1, wherein the upper gate structure includes:
   upper gate insulation patterns respectively on sidewalls of the channels, respectively; and
   an upper gate electrode extending in the second direction, the upper gate electrode contacting and surrounding outer sidewalls of the upper gate insulation patterns.

5. The semiconductor device according to claim 4, wherein the upper gate electrode has an upper surface that is lower than an upper surface of the upper gate insulation patterns.

6. The semiconductor device according to claim 5, further comprising an insulation pattern on the upper gate electrode, the insulation pattern having an upper surface that is substantially coplanar with the upper surface of the upper gate insulation patterns.

7. The semiconductor device according to claim 4, further comprising:
- an insulating interlayer covering sidewalls and the upper surfaces of the bit line structures; and
- a spacer layer on the insulating interlayer, wherein:
- each of the channels extends through a corresponding one of the upper gate structures, the spacer layer, and an upper portion of the insulating interlayer and contacts an upper surface of a corresponding one of the bit line structures; and
- the upper gate structures are on the spacer layer.

8. The semiconductor device according to claim 7, wherein the gate insulation patterns are connected to each other and contact an upper surface of the spacer layer.

9. The semiconductor device according to claim 1, wherein each of the channels includes polysilicon or single crystalline silicon.

10. The semiconductor device according to claim 9, further comprising an impurity region at an upper portion of each of the channels, the impurity region being doped with n-type impurities or p-type impurities.

11. The semiconductor device as claimed in claim 1, wherein:
- the bit line structure includes a first bit line and a second bit line stacked in a third direction substantially perpendicular to the upper surface of the substrate,
- the first bit line includes a metal, and
- the second bit line includes polysilicon doped with impurities.

12. The semiconductor device according to claim 1, further comprising transistors, each transistor including:
- a lower gate structure on the substrate; and
- impurity regions at upper portions of the substrate adjacent to the lower gate structure,
- wherein the transistors are electrically connected to the bit line structures, respectively.

13. A semiconductor device, comprising:
- a substrate;
- a lower circuit pattern on the substrate, the lower circuit pattern including a lower gate structure and a first impurity region;
- a bit line structure on the lower circuit pattern, the bit line structure being electrically connected to the lower circuit pattern;
- a channel contacting an upper surface of the bit line structure, the channel including a second impurity region at an upper portion thereof;
- an upper gate structure surrounding the channel, the upper gate structure being spaced apart from the bit line structure; and
- a capacitor structure, the capacitor structure including:
  - a first capacitor electrode on the second impurity region;
  - a dielectric layer on the first capacitor electrode, the dielectric layer including a ferroelectric material or an anti-ferroelectric material;
  - a second capacitor electrode on the dielectric layer; and
  - a capacitor plate electrode on the second capacitor electrode.

14. The semiconductor device according to claim 13, wherein:
- the channel includes polysilicon, and
- the second impurity region includes n-type impurities or p-type impurities.

15. The semiconductor device according to claim 13, wherein the upper gate structure includes:

- an upper gate insulation pattern on a sidewall of the channel; and
- an upper gate electrode contacting an outer sidewall of the upper gate insulation pattern.

16. The semiconductor device according to claim 15, further comprising an insulation pattern on the upper gate electrode,
wherein:
- the upper gate electrode has an upper surface that is lower than an upper surface of the upper gate insulation pattern, and
- the insulation pattern has an upper surface that is substantially coplanar with the upper surface of the upper gate insulation pattern.

17. A semiconductor device, comprising:
- a substrate;
- bit line structures on the substrate, the bit line structures each extending in a first direction substantially parallel to an upper surface of the substrate, and being spaced apart from each other in a second direction substantially parallel to the upper surface of the substrate and crossing the first direction;
- an insulating interlayer on the substrate, the insulating interlayer covering sidewalls and upper surfaces of the bit line structures;
- a spacer layer on the insulating interlayer;
- upper gate structures on the spacer layer, the upper gate structures each extending in the second direction and being spaced apart from each other in the first direction;
- channels each extending through a corresponding one of the upper gate structures, the spacer layer, and an upper portion of the insulating interlayer and contacting an upper surface of a corresponding one of the bit line structures, the channels being spaced apart from each other in the first and second directions; and
- a capacitor structure, the capacitor structure including:
  - first capacitor electrodes respectively on the channels;
  - a dielectric layer on the first capacitor electrodes, the dielectric layer including a ferroelectric material or an anti-ferroelectric material;
  - a second capacitor electrode layer on the dielectric layer; and
  - capacitor plate electrodes on the second capacitor electrode layer, the capacitor plate electrodes each extending in the second direction and being spaced apart from each other in the first direction.

18. The semiconductor device according to claim 17, wherein each of the capacitor plate electrodes overlaps a corresponding one of the upper gate structures in a third direction substantially perpendicular to the upper surface of the substrate.

19. The semiconductor device according to claim 18, further comprising transistors, each transistor including:
- a lower gate structure on the substrate; and
- impurity regions at upper portions of the substrate adjacent to the lower gate structure,
- wherein the transistors are electrically connected to the bit line structures, respectively.

20. The semiconductor device according to claim 17, wherein the upper gate structure includes:
- upper gate insulation patterns respectively on sidewalls of the channels; and
- an upper gate electrode extending in the second direction, the upper gate electrode contacting and surrounding outer sidewalls of the upper gate insulation patterns.

* * * * *